United States Patent
Lim et al.

(10) Patent No.: US 10,930,728 B2
(45) Date of Patent: Feb. 23, 2021

(54) ORGANIC LIGHT-EMITTING DIODE DISPLAY AND METHOD OF MANUFACTURING THE SAME

(71) Applicant: LG Display Co., Ltd., Seoul (KR)

(72) Inventors: Sanghyun Lim, Goyang-si (KR); Chungwan Oh, Paju-si (KR); Daegyu Jo, Seoul (KR); Kiyoung Sung, Seoul (KR); Youngju Park, Seoul (KR)

(73) Assignee: LG Display Co., Ltd., Seoul (KR)

( * ) Notice: Subject to any disclaimer, the term of this patent is extended or adjusted under 35 U.S.C. 154(b) by 98 days.

(21) Appl. No.: 15/841,797

(22) Filed: Dec. 14, 2017

(65) Prior Publication Data

US 2018/0175135 A1    Jun. 21, 2018

(30) Foreign Application Priority Data

Dec. 19, 2016   (KR) .......................... 10-2016-0173914

(51) Int. Cl.
*H01L 27/32* (2006.01)
*H01L 27/12* (2006.01)
*H01L 51/52* (2006.01)

(52) U.S. Cl.
CPC ........ *H01L 27/3297* (2013.01); *H01L 27/124* (2013.01); *H01L 27/127* (2013.01); *H01L 27/1214* (2013.01); *H01L 27/3272* (2013.01); *H01L 27/3276* (2013.01); *H01L 51/5203* (2013.01); *H01L 27/3262* (2013.01); *H01L 27/3265* (2013.01)

(58) Field of Classification Search
CPC . H01L 27/3297; H01L 27/124; H01L 27/127; H01L 27/3272; H01L 51/5203; H01L 27/3276; H01L 27/1214; H01L 27/3262; H01L 27/3265; H01L 2227/323
See application file for complete search history.

(56) References Cited

U.S. PATENT DOCUMENTS

| | | | |
|---|---|---|---|
| 2004/0135148 A1* | 7/2004 | Lin | H01L 27/12 257/72 |
| 2010/0079419 A1* | 4/2010 | Shibusawa | H01L 27/3272 345/204 |
| 2015/0206931 A1* | 7/2015 | Choi | H01L 27/3272 257/72 |

* cited by examiner

*Primary Examiner* — Abhishek Sarma
(74) *Attorney, Agent, or Firm* — Morgan, Lewis & Bockius LLP

(57) ABSTRACT

An organic light-emitting diode display and a method of manufacturing the same are provided. An organic light-emitting diode display includes a plurality of pixels, each pixel includes an organic light-emitting diode, and the organic light-emitting diode display includes: a substrate, a horizontal line on the substrate, at least one first insulating layer on the horizontal line, a shielding electrode on the at least one first insulating layer, at least one second insulating layer on the shielding electrode, a data line on the at least one second insulating layer, the data line crossing the horizontal line, the shielding electrode overlapping the horizontal line and the data line at a crossing of the horizontal line and the data line, and a constant voltage source connected to the shielding electrode.

9 Claims, 26 Drawing Sheets

FIG. 6

|    | Ti  | Ts  | Tp  | Te  |
|----|-----|-----|-----|-----|
| T4 | Off | On  | Off | On  |
| T3 | On  | Off | Off | Off |
| T2 | Off | On  | Off | On  |
| T1 | On  | On  | On  | Off |

ORGANIC LIGHT-EMITTING DIODE DISPLAY AND METHOD OF MANUFACTURING THE SAME

CROSS-REFERENCE TO RELATED APPLICATIONS

This application claims the priority of Korean Application No. 10-2016-0173914, filed on Dec. 19, 2016, the entirety of which is hereby incorporated by reference.

BACKGROUND

1. Technical Field

The present disclosure relates to an organic light-emitting diode display and a method of manufacturing the same.

2. Discussion of the Related Art

Various types of flat panel displays (FPDs) have been used to replace heavier and larger cathode ray tubes (CRTs). Examples of the flat panel display include a liquid crystal display (LCD), a field emission display (FED), a plasma display panel (PDP), and an organic light-emitting diode (OLED) display.

In more detail, an OLED display is a self-emission display device configured to emit light by exciting an organic compound. The OLED display does not require a backlight unit as needed in a liquid crystal display, and thus has a thin profile, light weight, and a simple manufacturing process. The OLED display has been widely used because it can also be manufactured at a low temperature and has characteristics including a fast response time of 1 ms or less, low power consumption, a wide viewing angle, a high contrast, etc.

The OLED display includes organic light-emitting diodes, each of which converts electric energy into light energy. Each organic light-emitting diode includes an anode, a cathode, and an organic light-emitting layer between the anode and the cathode. Holes are injected from the anodes, and electrons are injected from the cathode. When the holes and the electrons injected through the anode and the cathode are injected into the organic light-emitting layer, the holes and the electrons combine to form excitons. The excitons emit light while converting energy into light.

As a high resolution of display devices is recently desired, the size of pixels tends to become smaller and smaller. Each pixel includes a transistor, a capacitor, and an organic light-emitting diode. As the size of the pixels having the above-described configuration become smaller, the transistors and signal lines (for example, scan lines and data lines) are integrated and are disposed close to each other.

The scan lines and the data lines are disposed to cross each other, and a parasitic capacitor is formed in an overlap portion of the scan lines and the data lines. In this instance, a ripple may occur in a voltage applied to the scan line due to change in a data voltage applied to the data line. A user may recognize a ripple phenomenon generated by interference of the data voltage as a defective drive, for example, a luminance reduction. The defective drive leads to a reduction in display quality and reliability of the display device.

SUMMARY

Accordingly, the present disclosure is directed to an organic light-emitting diode display and a method of manufacturing the same that substantially obviate one or more of the issues due to limitations and disadvantages of the related art.

An aspect of the present disclosure is to provide an organic light-emitting diode display capable of preventing or reducing a ripple resulting from change in a data voltage from occurring in a signal line crossing a data line by further including a shielding electrode.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts as embodied and broadly described, there is provided an organic light-emitting diode display, including a plurality of pixels, each pixel including an organic light-emitting diode, including: a substrate, a horizontal line on the substrate, at least one first insulating layer on the horizontal line, a shielding electrode on the at least one first insulating layer, at least one second insulating layer on the shielding electrode, a data line on the at least one second insulating layer, the data line crossing the horizontal line, the shielding electrode overlapping the horizontal line and the data line at a crossing of the horizontal line and the data line, and a constant voltage source connected to the shielding electrode.

In another aspect, there is provided a method of manufacturing an organic light-emitting diode display including providing a plurality of pixels, each pixel including an organic light-emitting diode, the method including: providing a substrate, providing a horizontal line on the substrate, providing at least one first insulating layer on the horizontal line, providing a shielding electrode on the at least one first insulating layer, providing at least one second insulating layer on the shielding electrode, providing a data line on the at least one second insulating layer, the data line crossing the horizontal line, the shielding electrode overlapping the horizontal line and the data line at a crossing of the horizontal line and the data line, and providing a constant voltage source connected to the shielding electrode.

Other systems, methods, features and advantages will be, or will become, apparent to one with skill in the art upon examination of the following figures and detailed description. It is intended that all such additional systems, methods, features and advantages be included within this description, be within the scope of the present disclosure, and be protected by the following claims. Nothing in this section should be taken as a limitation on those claims. Further aspects and advantages are discussed below in conjunction with the embodiments of the disclosure. It is to be understood that both the foregoing general description and the following detailed description of the present disclosure are examples and explanatory, and are intended to provide further explanation of the disclosure as claimed.

BRIEF DESCRIPTION OF THE DRAWINGS

The accompanying drawings, that may be included to provide a further understanding of the disclosure and are incorporated in and constitute a part of this specification, illustrate embodiments of the disclosure and together with the description serve to explain various principles of the disclosure.

FIG. 6 illustrates turn-on and turn-off timing of thin film transistors of a pixel.

Figure 1:
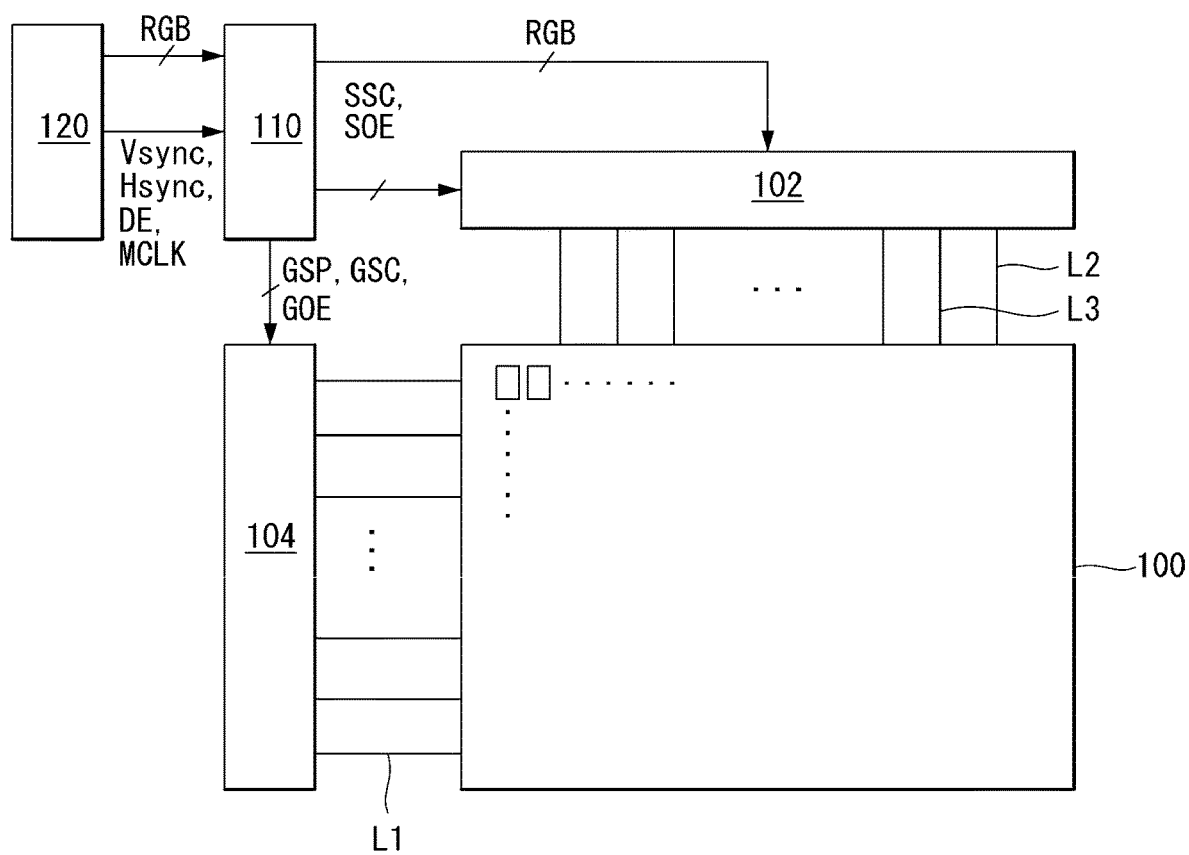
FIG. 1 is a block diagram of an organic light-emitting diode (OLED) display according to an example embodiment.

Throughout the drawings and the detailed description, unless otherwise described, the same drawing reference numerals should be understood to refer to the same elements, features, and structures. The relative size and depiction of these elements may be exaggerated for clarity, illustration, and convenience.

DETAILED DESCRIPTION

Reference will now be made in detail to some embodiments of the present disclosure, examples of that may be illustrated in the accompanying drawings. In the following description, when a detailed description of well-known functions or configurations related to this document is determined to unnecessarily cloud a gist of the inventive concept, the detailed description thereof will be omitted. The progression of processing steps and/or operations described is an example; however, the sequence of steps and/or operations is not limited to that set forth herein and may be changed as is known in the art, with the exception of steps and/or operations necessarily occurring in a particular order. Like reference numerals designate like elements throughout. Names of the respective elements used in the following explanations are selected only for convenience of writing the specification and may be thus different from those used in actual products.

In the description of embodiments, when a structure is described as being positioned "on or above" or "under or below" another structure, this description should be construed as including a case in which the structures contact each other as well as a case in which a third structure is disposed therebetween.

Figure 2:
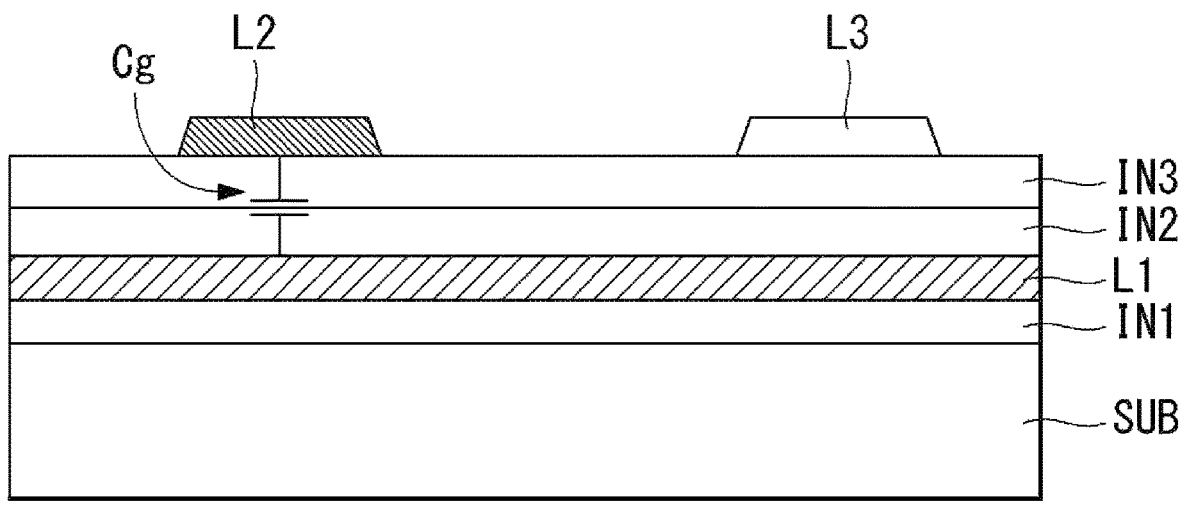
FIGS. 2 and 3 are cross-sectional views for explaining characteristics of an OLED display according to an example embodiment.
Figure 3:
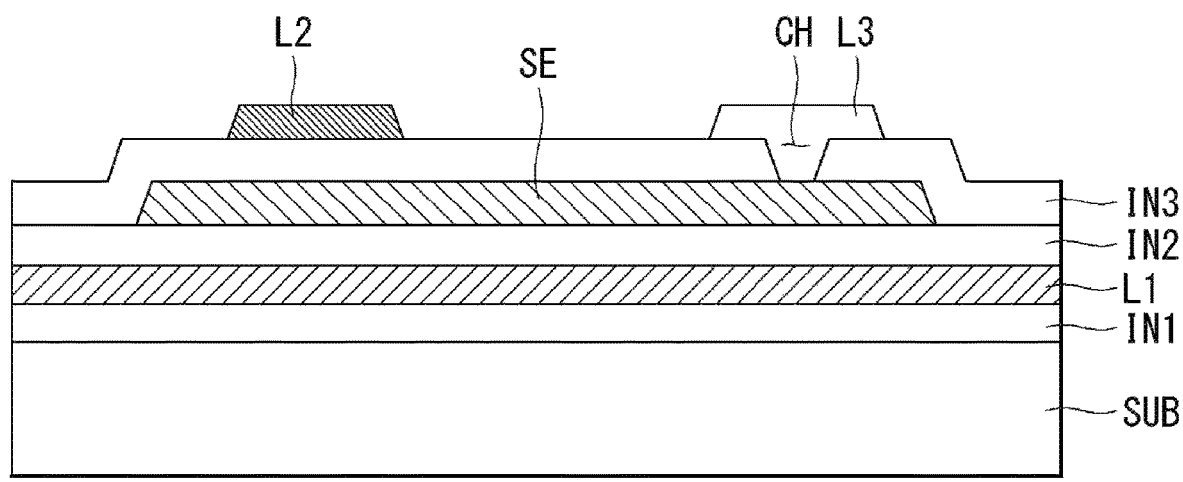

FIG. 1 is a block diagram of an organic light-emitting diode (OLED) display according to an example embodiment. FIGS. 2 and 3 are cross-sectional views for explaining characteristics of an OLED display according to an example embodiment.

As shown in the FIG. 1 example, an OLED display according to an example embodiment may include a display panel 100, a data driver 102, a scan driver 104, and a timing controller 110. The display panel 100 may include a pixel array that may include pixels arranged in a matrix, and may display an input image. The pixels may include red, green, and blue pixels for color implementation. The pixels may further include white pixels for emitting white light. Each pixel may include a color filter. In addition, each pixel may include one or more switching elements, a driving element supplying a current to an organic light-emitting diode (OLED), a capacitor, and the like.

The pixels may be partitioned by horizontal lines L1 and vertical lines L2 and L3 crossing each other. The horizontal lines L1 may include scan lines supplied with a scan signal and emission lines supplied with an emission signal EM. The vertical lines L2 and L3 may include data lines L2 supplied with a data voltage and power lines L3 connected to a constant voltage source. For example, the constant voltage source may be a high potential voltage source EVDD.

The data driver 102 may generate a reference voltage Vref and a data voltage Vdata. The data driver 102 may convert digital video data RGB of an input image received from the timing controller 110 into a gamma compensation voltage to generate the data voltage Vdata, and may supply the data voltage Vdata to the data lines L2. The data driver 102 may generate the predetermined reference voltage Vref regardless of the input image, and may supply the reference voltage Vref to the data lines L2.

The scan driver 104 may include a scan circuit and an emission circuit that may receive an output of the scan circuit. The scan circuit and the emission circuit may respectively generate the scan signal and the emission signal EM, and may sequentially supply the scan signal and the emission signal EM to the different horizontal lines L1. For example, the scan signal may be supplied to the pixels through the scan lines connecting the pixels to the scan driver 104, and the emission signal EM may be supplied to the pixels through the emission lines.

The timing controller 110 may transmit the digital video data RGB received from an external host system 120 to the data driver 102. The timing controller 110 may generate timing control signals for controlling operation timings of the data driver 102 and the scan driver 104 using timing signals, such as a vertical sync signal Vsync, a horizontal sync signal Hsync, a data enable signal DE, and a dot clock CLK, received from the host system 120. The timing controller 110 may further generate a source sampling clock SSC, a source output enable signal SOE, and so on for controlling the data driver 102. The timing controller 110 may also generate a gate start pulse GSP, a gate shift clock GSC, a gate output enable signal GOE, and so on for controlling the scan driver 104.

The host system 120 may be, for example, a television system, a set-top box, a navigation system, a DVD player, a Blu-ray player, a personal computer (PC), a home theater system, a phone system, a vehicle display, and other systems that include or operate in conjunction with a display. Embodiments are not limited to these examples.

With reference to FIG. 2, the horizontal line L1 may be on a substrate SUB with one or more first insulating layer L1 interposed therebetween. The horizontal line L1 and the data line L2 may cross each other with one or more second and third insulating layers IN2 and IN3 interposed therebetween. A parasitic capacitor Cg may be formed between the horizontal line L1 and the data line L2 that overlap each other with the one or more insulating layers IN2 and IN3 interposed therebetween. A ripple synchronized with change in the data voltage applied to the data line L2 may occur in a voltage (or a signal) applied to the horizontal line L1 due to the coupling between the horizontal line L1 and the data line L2 resulting from the parasitic capacitor Cg. The ripple resulting from the parasitic capacitor Cg may lead to a reduction in display quality of display devices, for example, luminance non-uniformity. Such a problem may be more problematic as elements and lines in high-resolution display devices are disposed adjacent to each other.

With reference to FIG. 3, the OLED display according to an embodiment may include a shielding electrode SE between the horizontal line L1 and the data line L2 to reduce or prevent the above-described problem. The shielding electrode SE may be formed in an overlap portion between the horizontal line L1 and the data line L2. The shielding electrode SE may overlap the horizontal line L1 with at least one second insulating layer IN2 interposed therebetween. The shielding electrode SE may overlap the data line L2 with at least one third insulating layer IN3 interposed therebetween. The shielding electrode SE may be electrically connected to the constant voltage source. For example, the shielding electrode SE may be connected to the high potential power line L3.

For example, the OLED display according to the embodiment may include the horizontal line L1, the shielding electrode SE, the data line L2, and the high potential power line L3. The shielding electrode SE may be formed on the horizontal line L1 with at least one second insulating layer IN2 interposed therebetween. The shielding electrode SE may overlap at least a portion of the horizontal line L1, and may be insulated from the horizontal line L1 by at least one second insulating layer IN2 between the shielding electrode SE and the horizontal line L1.

The data line L2 and the high potential power line L3 may be formed on the shielding electrode SE with at least one third insulating layer IN3 interposed therebetween. The data line L2 may cross the horizontal line L1, and may overlap the horizontal line L1 at a crossing between the data line L2 and the horizontal line L1. The shielding electrode SE may be positioned between the data line L2 and the horizontal line L1 at the crossing. The data line L2 may be insulated from the shielding electrode SE by at least one third insulating layer IN3 between the data line L2 and the shielding electrode SE.

The high potential power line L3 may be spaced apart from the data line L2 by a particular distance at the same layer as the data line L2. The high potential power line L3 may be electrically connected to the shielding electrode SE through a contact hole CH penetrating at least one third insulating layer IN3 between the high potential power line L3 and the shielding electrode SE.

Because a constant voltage may be applied to the shielding electrode SE, a ripple resulting from coupling between the horizontal line L1 and the shielding electrode SE may not occur in the horizontal line L1. Further, the horizontal line L1 may not sensitively respond to change in the data voltage owing to the shielding electrode SE positioned between the horizontal line L1 and the data line L2 and connected to the constant voltage source. In other words, the OLED display according to an embodiment can reduce or prevent the ripple resulting from the change in the data voltage from occurring in the voltage applied to the horizontal line L1 because the horizontal line L1 may be shielded from the data line L2 by the shielding electrode SE.

Hereinafter, advantages and effects of embodiments of the present disclosure will be described in detail through example embodiments.

First Example Embodiment

Figure 4:
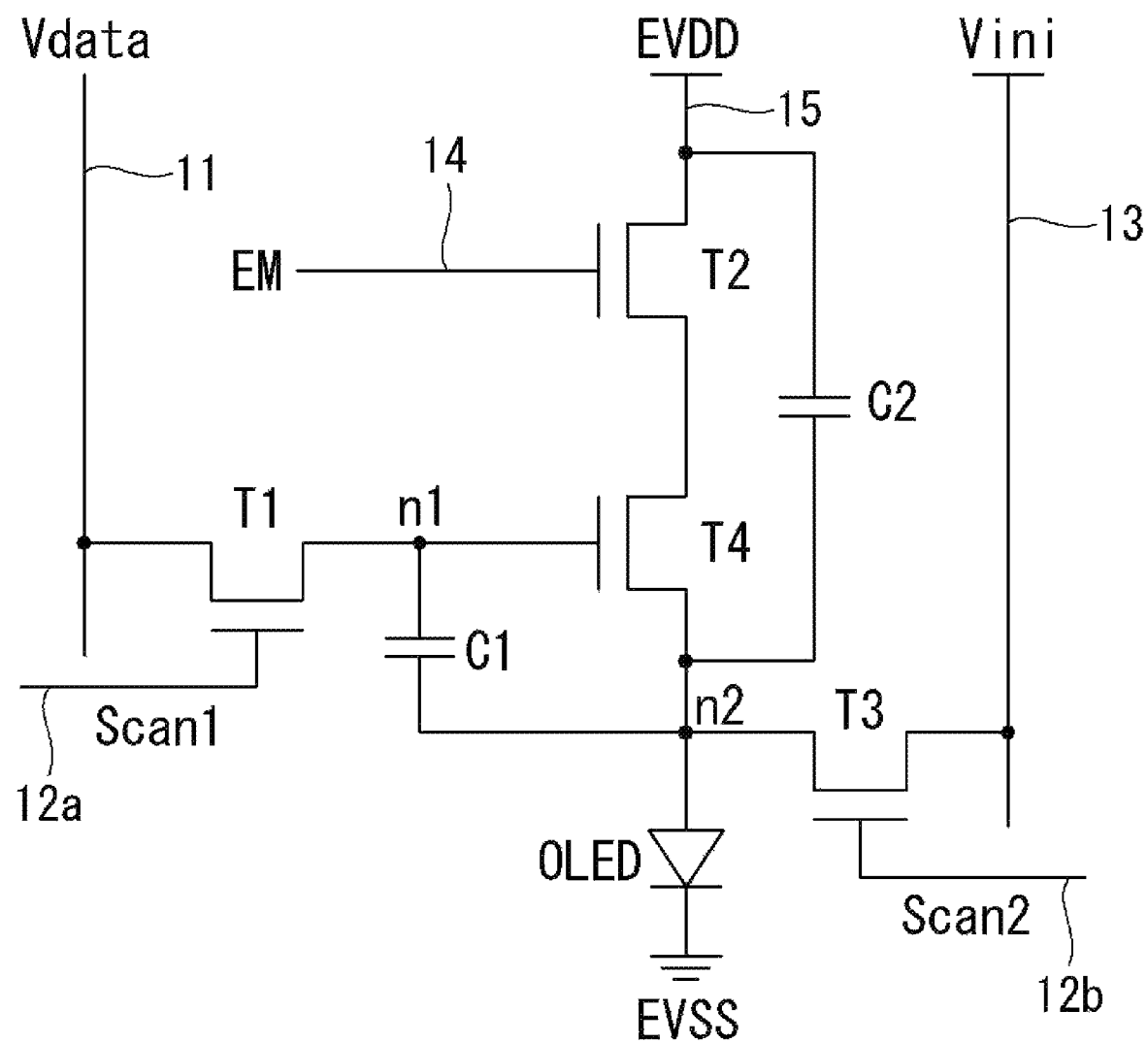
FIG. 4 is a circuit diagram illustrating a pixel structure of an OLED display according to a first example embodiment.
Figure 5:
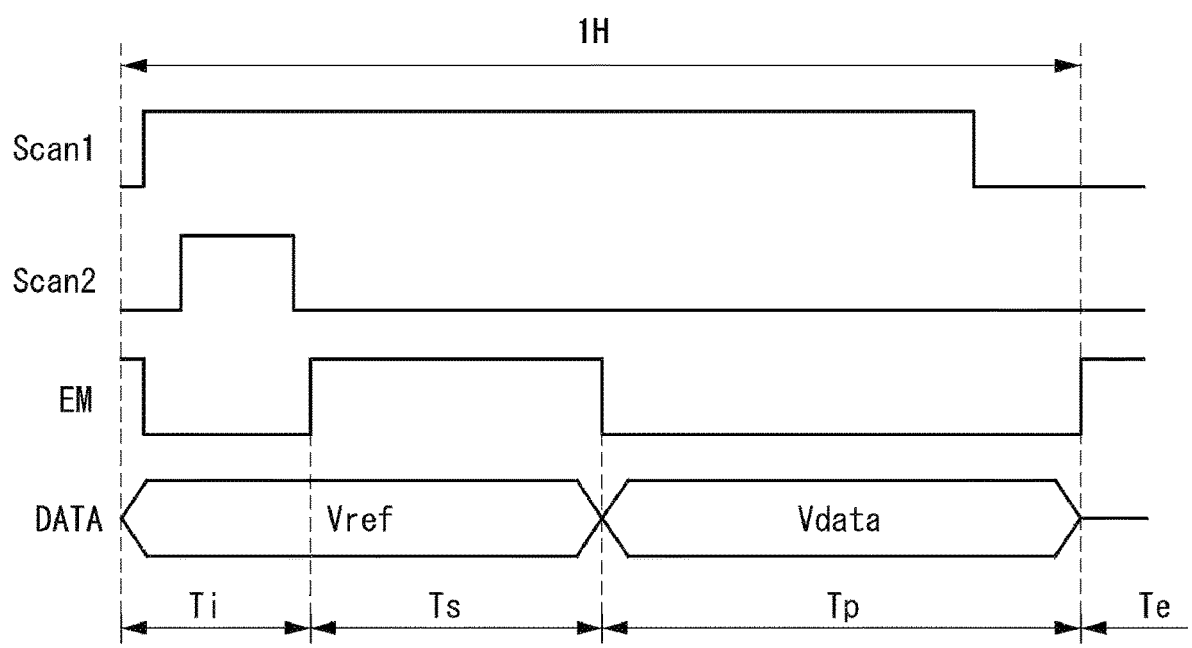
FIG. 5 is a waveform diagram illustrating an operation of the pixel shown in FIG. 4.

FIG. 4 is a circuit diagram illustrating a pixel structure of an OLED display according to a first example embodiment. FIG. 5 is a waveform diagram illustrating an operation of the pixel shown in FIG. 4. FIG. 6 illustrates turn-on and turn-off timing of thin film transistors of a pixel.

With reference to FIGS. 4 to 6, each pixel may include an OLED, first to fourth TFTs T1 to T4, and first and second capacitors C1 and C2. For example, a pixel according to the first example embodiment has a 4T2C circuit structure including four transistors and two capacitors.

An initialization period Ti, a sampling period Ts, and a programming period Tp may be included in one horizontal period 1H of the pixel. During one horizontal period 1H, a threshold voltage of the fourth TFT T4 serving as a driving element of the pixel may be sampled, and a data voltage may be compensated by the sampled threshold voltage. Thus, during one horizontal period 1H, data of an input image may be compensated by the threshold voltage of the driving element, and the compensated data may be written to the pixel.

A first scan signal Scan1 may be generated at an on-level during approximately one horizontal period 1H, and may turn on the first TFT T1. The first scan signal Scan1 may be inverted to an off-level in an emission period Te, and may turn off the first TFT T1.

A second scan signal Scan2 may be generated at an on-level in the initialization period Ti, and may turn on the third TFT T3. The second scan signal Scan2 may be maintained at an off-level during a remaining period, and may control the third TFT T3 in a turn-off state.

An emission signal EM may be generated at an on-level in the sampling period Ts, and may turn on the second TFT T2. The emission signal EM may be inverted to an off-level in the initialization period Ti and the programming period Tp, and may turn off the second TFT T2. The emission signal EM may be maintained at the on-level in the emission period Te, and may maintain the second TFT T2 in a turn-on state.

The OLED may emit light by a current received from the second TFT T2. The OLED may include an anode, a cathode, and an organic compound layer between the anode and the cathode. The organic compound layer may include a hole injection layer, a hole transport layer, a light-emitting layer, an electron transport layer, and an electron injection layer. However, embodiments are not limited thereto. The anode of the OLED may be connected to a second node n2, and the cathode of the OLED may be connected to a low potential voltage source EVSS (which may be referred to as "a ground level voltage source GND"). The low potential voltage source EVSS is not limited to a ground potential.

The first TFT T1 may be a switching TFT that may be switched in response to the first scan signal Scan1, and may turn on or off a current path between a data line 11 and a first node n1. A gate of the first TFT T1 may be connected to a first scan line 12a, and a drain of the first TFT T1 may be connected to the data line 11. Further, a source of the first TFT T1 may be connected to the first node n1.

The second TFT T2 may be a switching TFT that may be switched in response to the emission signal EM, and may turn on or off a current path between a high potential power line 15 and a drain of the fourth TFT T4. A gate of the second TFT T2 may be connected to an emission line 14, and a drain of the second TFT T2 may be connected to the high potential power line 15. Further, a source of the second TFT T2 may be connected to the drain of the fourth TFT T4.

The third TFT T3 may be a switching TFT that may be switched in response to the second scan signal Scan2, and may turn on or off a current path between a Vini line 13 and the second node n2. The Vini line 13 may indicate an initialization signal line. A gate of the third TFT T3 may be connected to a second scan line 12b, and a drain of the third TFT T3 may be connected to the second node n2. Further, a source of the third TFT T3 may be connected to the Vini line 13. An initialization signal Vini may be supplied to the Vini line 13.

The fourth TFT T4 may be a driving TFT that may control a current of the OLED, depending on a gate-to-source voltage Vgs of the fourth TFT T4. A gate of the fourth TFT T4 may be connected to the first node n1, and the drain of the fourth TFT T4 may be connected to the source of the second TFT T2. Further, a source of the fourth TFT T4 may be connected to the anode of the OLED.

The first capacitor C1 may be connected between the first node n1 and the second node n2, and may store a voltage difference between the first node n1 and the second node n2. The first capacitor C1 may sample a threshold voltage Vth of the fourth TFT T4 serving as a driving element in a source follower method. The second capacitor C2 may be connected between the high potential power line 15 and the second node n2. When a potential of the first node n1 changes depending on a data voltage Vdata in the programming period Tp, the first and second capacitors C1 and C2 may divide a change of the potential of the first node n1, and may reflect the potential change of the first node n1 to the second node n2.

An effect of the OLED display according to the first example embodiment is described in detail with reference to FIGS. 7 to 9.

Figure 7:
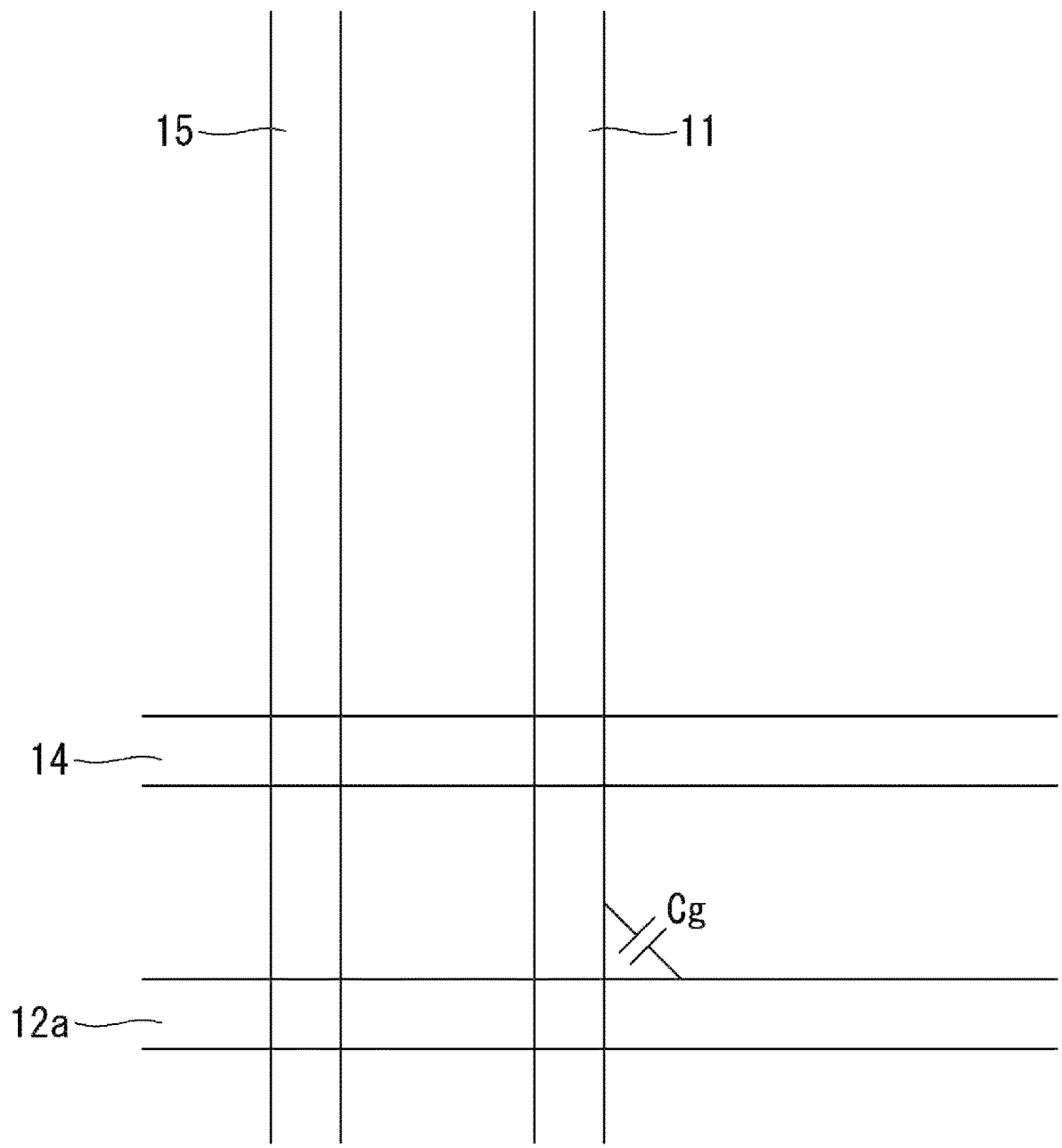
FIGS. 7 and 8 are plan views illustrating horizontal lines and vertical lines included in a pixel in an OLED display and comparatively illustrate an effect of an embodiment of the present disclosure.
Figure 8:
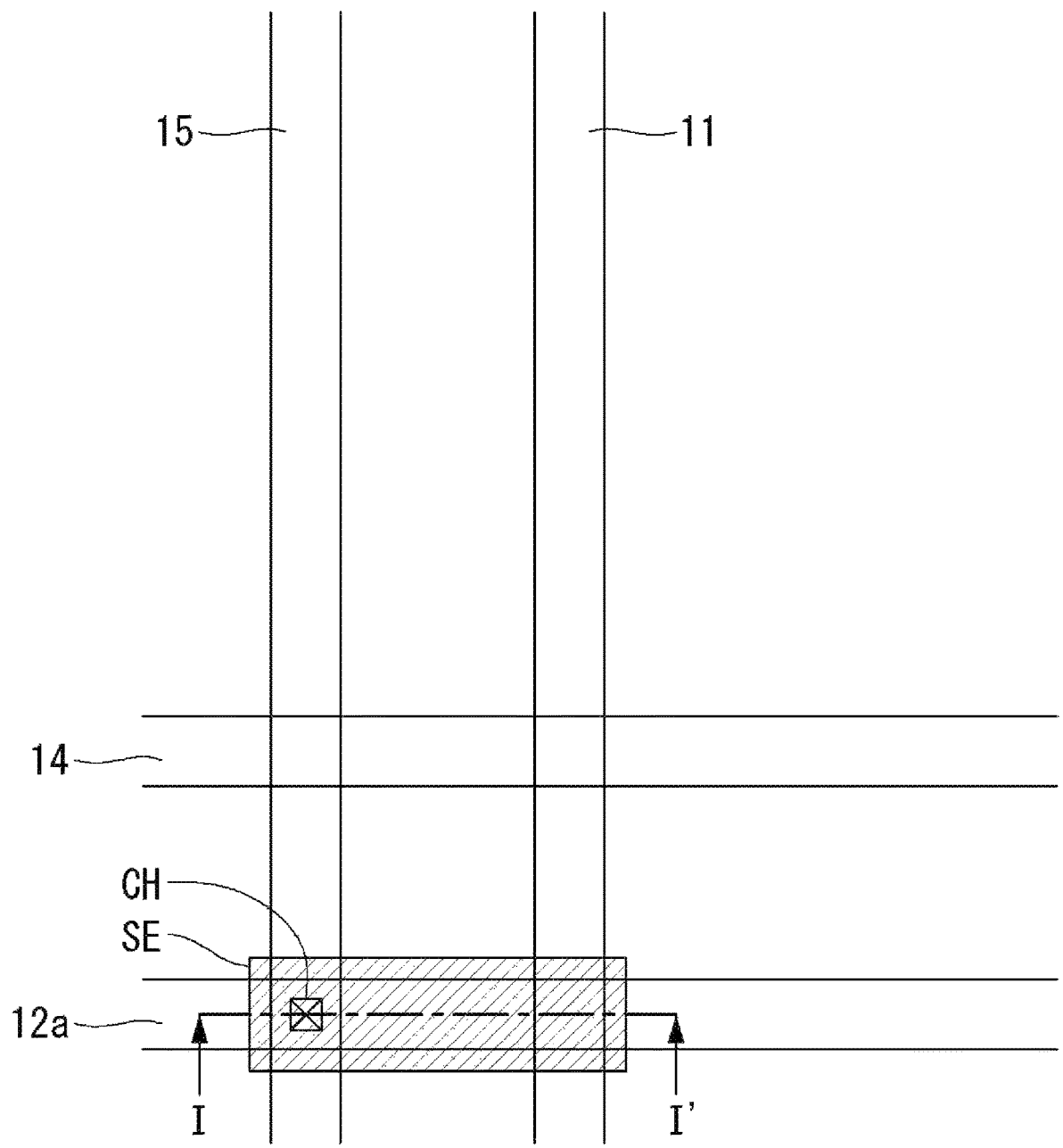

FIGS. 7 and 8 are plan views illustrating horizontal lines and vertical lines included in a pixel in an OLED display and comparatively illustrate an effect of an embodiment of the present disclosure. FIG. 9 is a cross-sectional view taken along line I-I' of FIG. 8.

For example, FIGS. 7 and 8 illustrate only an example characteristic configuration of the first example embodiment and schematically illustrate only the horizontal lines and the vertical lines for convenience of explanation.

As shown in the example of FIG. 7, one pixel may include the first scan line 12a and the emission line 14 that may be extended in a horizontal direction, and the data line 11 and the high potential power line 15 that may be extended in a vertical direction. The first scan signal Scan1 may be supplied to the first scan line 12a, and the emission signal EM may be supplied to the emission line 14. The data voltage Vdata may be supplied to the data line 11, and a high potential power voltage EVDD may be supplied to the high potential power line 15.

The first scan line 12a and the data line 11 may cross each other and overlap each other at a crossing between the first scan line 12a and the data line 11 with at least one insulating layer interposed therebetween. A parasitic capacitor Cg may be formed between the first scan line 12a and the data line 11. Because the first scan line 12a and the data line 11 may be coupled due to the parasitic capacitor Cg between the first scan line 12a and the data line 11, the first scan signal Scan1 may be synchronized with a rising edge or a falling edge of the data voltage Vdata and distorted.

For example, a gate timing control signal output from the timing controller 110 (see FIG. 1) may be changed to a voltage swinging between a gate-on voltage (e.g., a "VGH voltage") and a gate-off voltage (e.g., a "VGL voltage") by a level shifter (not shown). The VGH voltage may be a voltage higher than threshold voltages of TFTs of a pixel array and TFTs of the scan driver 104 (see FIG. 1). The VGL voltage may be a voltage lower than the threshold voltages of the TFTs of the pixel array and the TFTs of the scan driver 104 (see FIG. 1).

An emission circuit of the scan driver 104 may receive an output of a scan circuit and may operate. Thus, when a ripple occurs in the VGL voltage of the first scan signal Scan1 due to change in the data voltage Vdata, the ripple may affect the emission circuit connected to the scan circuit. For example, a high potential voltage of the emission signal EM output from the emission circuit may be relatively reduced due to the ripple of the VGL voltage of the first scan signal Scan1. This may lead to the distortion of the current of the OLED, and, as a result, may be recognized as a defective driving, such as a luminance reduction, by a user.

Figure 9:
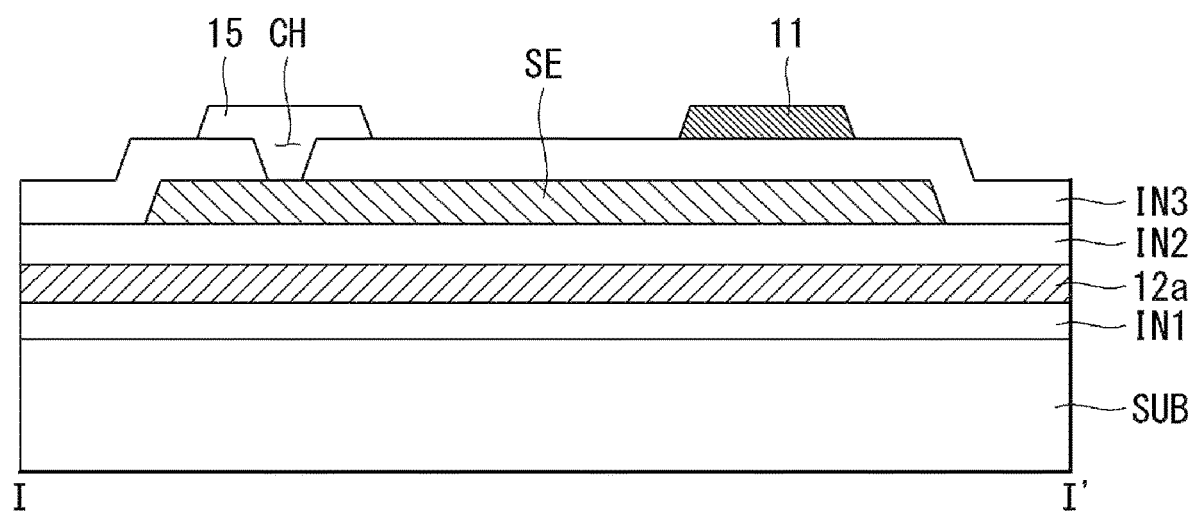
FIG. 9 is a cross-sectional view taken along line I-I' of FIG. 8.

With reference to the examples of FIGS. 8 and 9, the OLED display according to the first example embodiment may further include a shielding electrode SE connected to a constant voltage source to reduce or prevent the above-described problem. The shielding electrode SE may be formed at a crossing of the first scan line 12a and the data line 11. The shielding electrode SE may be spaced apart from the first scan line 12a in an overlap portion between the first scan line 12a and the data line 11, and may have at least one second insulating layer IN2 interposed therebetween. The shielding electrode SE may be spaced apart from the data line 11 in the overlap portion between the first scan line 12a and the data line 11, and may have at least one third insulating layer IN3 interposed therebetween. For example, the first scan line 12a, the shielding electrode SE, and the data line 11 may be disposed on different layers on a substrate SUB, with one or more insulating layers IN1, IN2, and IN3 interposed therebetween, and may be spaced apart from one another on the substrate SUB.

For example, the first scan line 12a may be formed on the substrate SUB. At least one first insulating layer IN1 may be further disposed between the substrate SUB and the first scan line 12a. The shielding electrode SE may be formed on the first scan line 12a, and may have at least one second insulating layer IN2 interposed therebetween. The data line 11 and the high potential power line 15 may be disposed to be spaced apart from each other on the shielding electrode SE, and may have at least one third insulating layer IN3 interposed therebetween.

The data line 11 may cross the first scan line 12a. The shielding electrode SE may be disposed to overlap the first scan line 12a and the data line 11 at the crossing of the first scan line 12a and the data line 11. The high potential power line 15 may be connected to the shielding electrode SE through a contact hole CH penetrating at least one third insulating layer IN3 between the high potential power line 15 and the shielding electrode SE.

The OLED display according to the first example embodiment may further include the shielding electrode SE, thereby removing the coupling between the first scan line 12a and the data line 11 through a reduction in a parasitic capacitance between the first scan line 12a and the data line 11. Hence, the first example embodiment can prevent or reduce the ripple resulting from the change in the data voltage Vdata from occurring in the VGL voltage of the first scan signal Scan1, and thus can provide an OLED display with improved display quality.

Figure 10A:
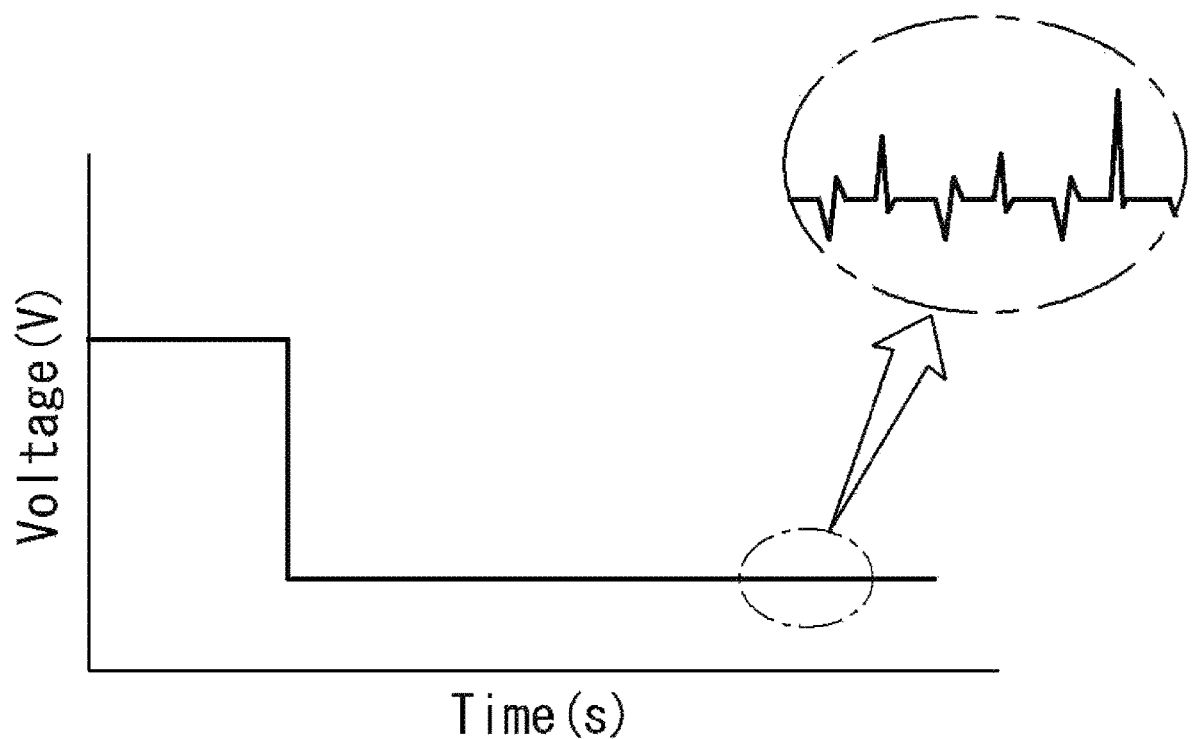
FIGS. 10A and 10B respectively illustrate simulation results in a case in which a shielding electrode is provided, and a case in which the shielding electrode is not provided.
Figure 10B:
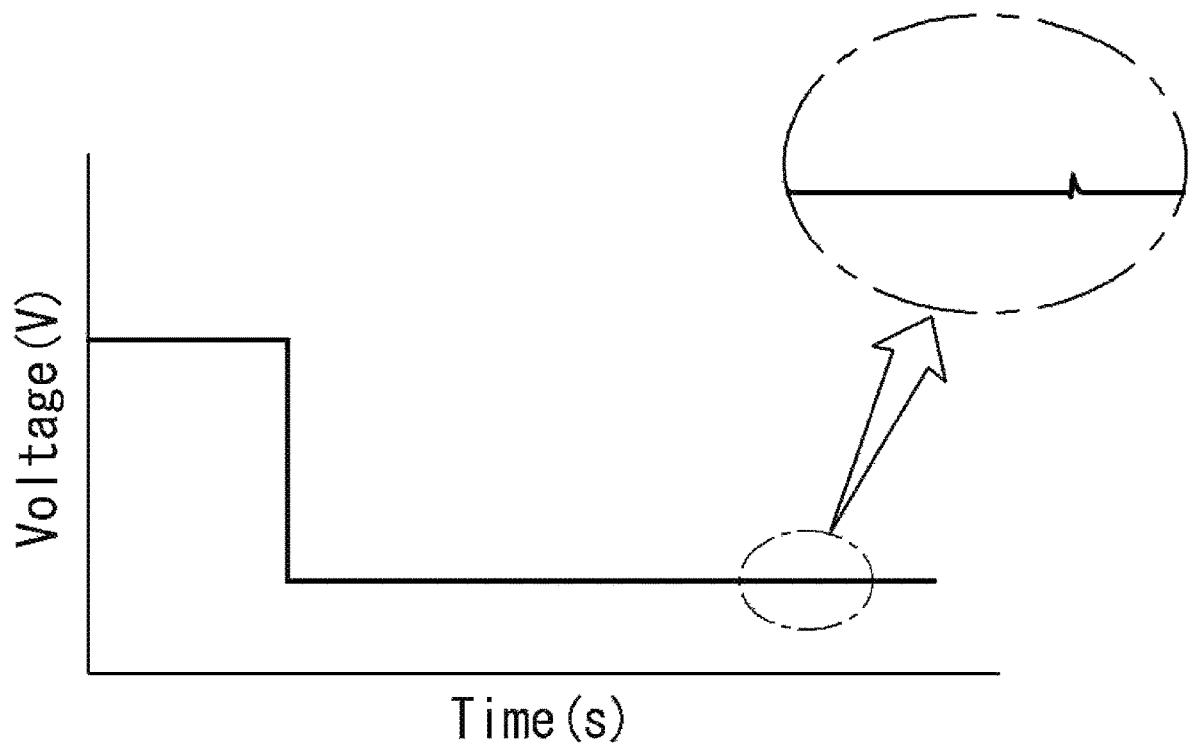

FIGS. 10A and 10B respectively illustrate simulation results in a case in which a shielding electrode is provided, and a case in which the shielding electrode is not provided.

For example, FIGS. 10A and 10B illustrate simulation results through the measurement of change in the VGL voltage of the first scan signal. As shown in FIG. 10A, when the shielding electrode was not provided, the ripple resulting from change in the data voltage Vdata frequently occurred in the VGL voltage of the first scan signal Scan1. On the other hand, as shown in FIG. 10B, when the shielding electrode was provided, the generation of ripple resulting from change in the data voltage Vdata in the VGL voltage of the first scan signal Scan1 was minimized.

Second Example Embodiment

Figure 11:
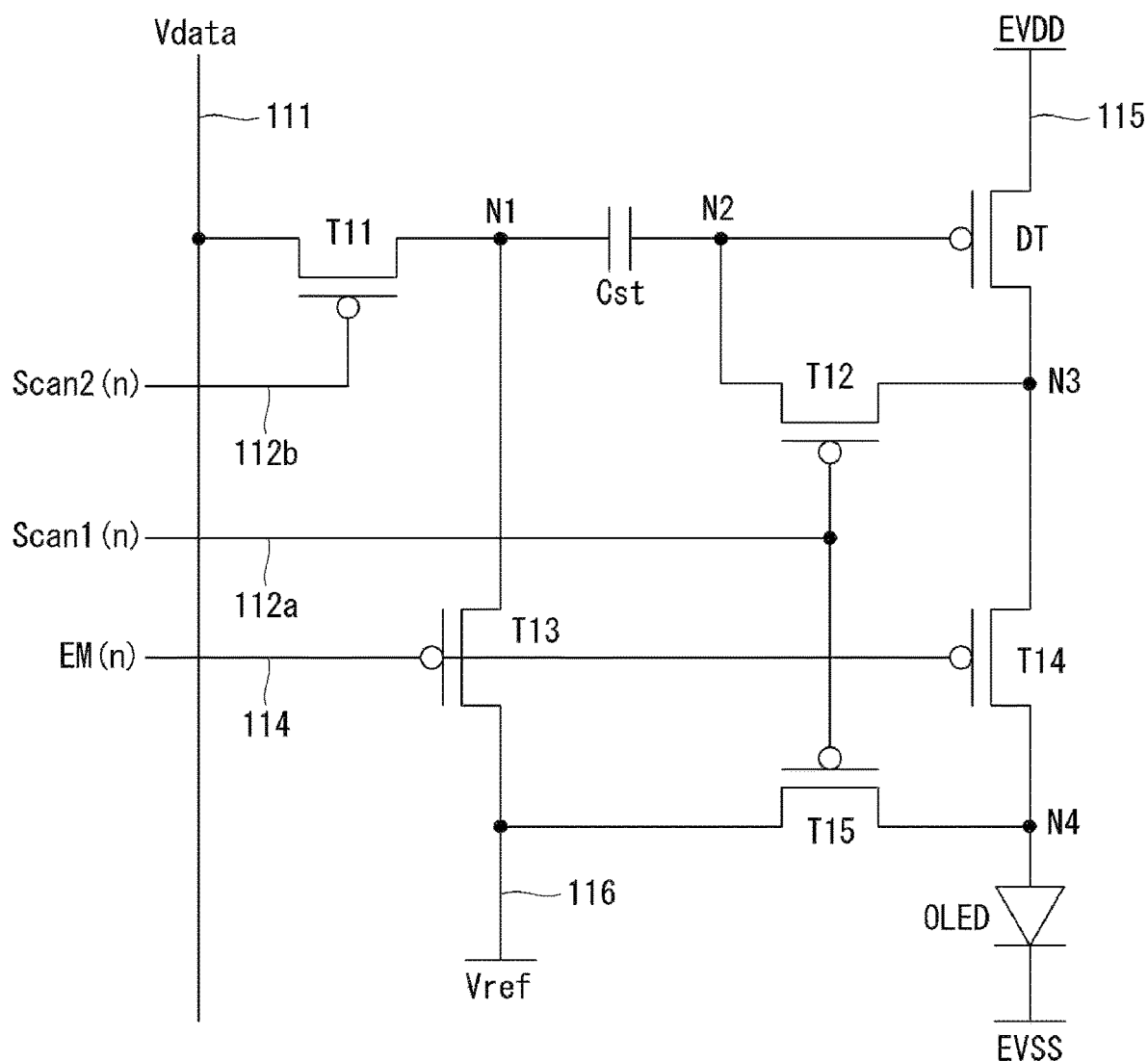
FIG. 11 is a circuit diagram illustrating a pixel structure of an OLED display according to a second example embodiment.
Figure 12:
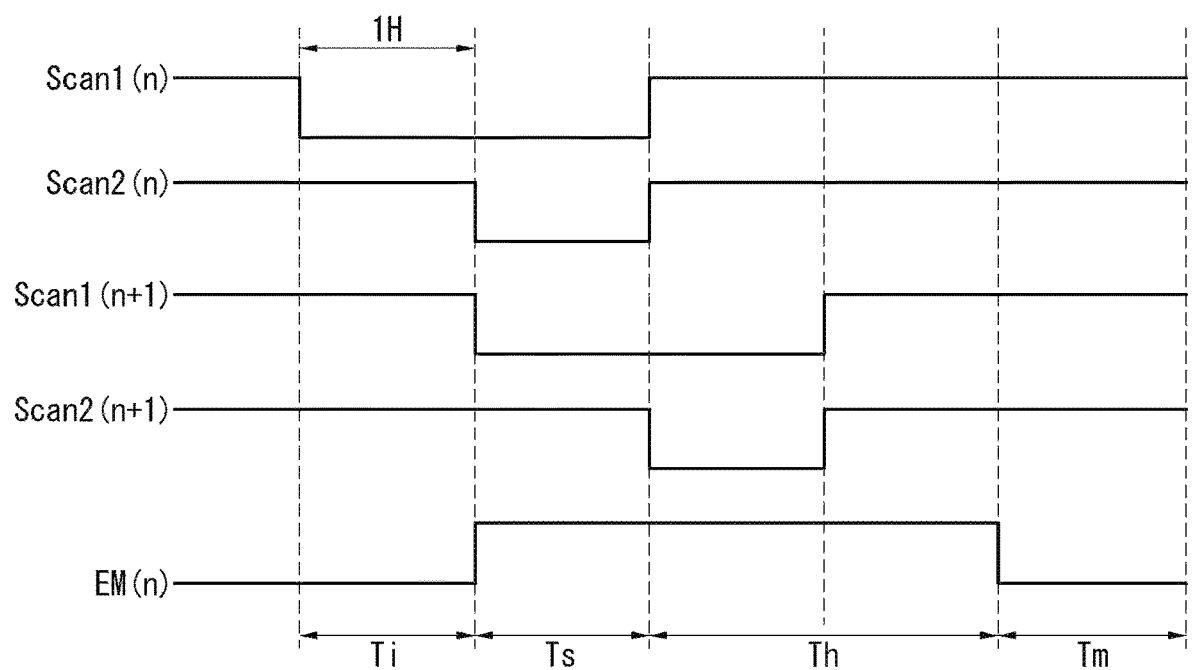
FIGS. 12 and 13 are waveform diagrams illustrating an operation of a pixel shown in FIG. 11.
Figure 13:
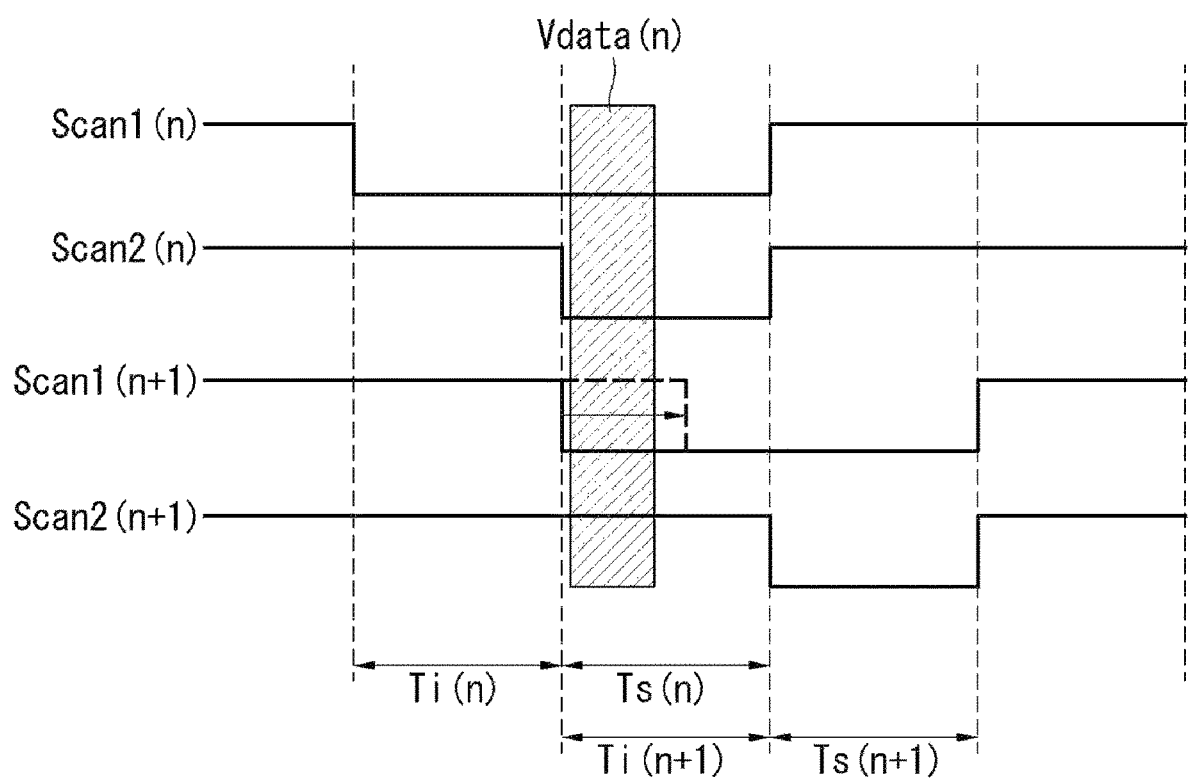

FIG. 11 is a circuit diagram illustrating a pixel structure of an OLED display according to a second example embodiment. FIGS. 12 and 13 are waveform diagrams illustrating an operation of a pixel shown in FIG. 11.

For example, the FIG. 11 example illustrates a structure of a pixel on an $n^{th}$ line, where n is an integer equal to or greater than 1. As shown in the example of FIG. 11, each pixel may include an OLED, first to fifth TFTs T11 to T15, a driving TFT DT, and a storage capacitor Cst. For example, the pixel according to the second example embodiment has a 6T1C circuit structure, including six transistors and one capacitor.

The OLED may emit light by a driving current received from the driving TFT DT. The OLED may include an anode, a cathode, and an organic compound layer having a multi-layered structure between the anode and the cathode. The anode of the OLED may be connected to a fourth node N4, and the cathode of the OLED may be connected to an input terminal of a low potential voltage source EVSS.

The driving TFT DT may control the driving current applied to the OLED depending on a source-to-gate voltage Vsg of the driving TFT DT. A source of the driving TFT DT may be connected to an input terminal of a high potential voltage source EVDD, and a gate of the driving TFT DT may be connected to a second node N2. Further, a drain of the driving TFT DT may be connected to a third node N3.

The first TFT T11 may include a gate connected to a second scan line 112b, a source connected to a data line 111 supplied with a data voltage Vdata, and a drain connected to a first node N1. As a result, the first TFT T11 may apply the data voltage Vdata received from the data line 111 to the first node N1 in response to a second scan signal Scan2(n).

The second TFT T12 may include a source connected to the third node N3, a drain connected to the second node N2, and a gate connected to a first scan line 112a. The second TFT T12 may diode-connects the gate and the drain of the driving TFT DT in response to a first scan signal Scan1(n).

The third TFT T13 may include a gate connected to an emission line 114, a source connected to the first node N1, and a drain connected to a reference voltage line 116. As a result, the third TFT T13 may apply a reference voltage Vref to the first node N1 in response to an emission signal EM(n).

The fourth TFT T14 may include a source connected to the third node N3, a drain connected to the fourth node N4, and a gate connected to the emission line 114. As a result, the fourth TFT T14 may form a current path between the third node N3 and the fourth node N4 in response to the emission signal EM(n).

The fifth TFT T15 may include a drain connected to the fourth node N4, a source connected to the reference voltage line 116, and a gate connected to the first scan line 112a. The fifth TFT T15 may apply the reference voltage Vref to the fourth node N4 in response to the first scan signal Scan1(n).

The storage capacitor Cst may include a first electrode connected to the first node N1 and a second electrode connected to the second node N2.

With reference to FIG. 12, one frame period in the OLED display may be divided into an initialization period Ti, a sampling period Ts, and an emission period Tm. The initialization period Ti may be a period in which a gate voltage of the driving TFT DT is initialized. The sampling period Ts may be a period in which a voltage of the anode of the OLED is initialized, and a threshold voltage Vth of the driving TFT DT is sampled and is stored in the second node N2. The emission period Tm may be a period in which a source-to-gate voltage of the driving TFT DT including the sampled threshold voltage Vth is programmed, and the OLED may emit light with a driving current according to the programmed source-to-gate voltage.

During the initialization period Ti, the first scan signal Scan1(n) and the emission signal EM(n) may be applied as a gate-on voltage. As a result, the second TFT T12 and the fifth TFT T15 may be turned on by the first scan signal Scan1(n), and the third TFT T13 and the fourth TFT T14 may be turned on by the emission signal EM(n). During the initialization period Ti, the first node N1 may be supplied with the reference voltage Vref, and the second to fourth nodes N2 to N4 may be initialized to the reference voltage Vref. The reference voltage Vref may be selected within a voltage range sufficiently less than an operating voltage of the OLED, and may be set to a voltage equal to or less than a low potential power voltage EVSS.

During the sampling period Ts, the first scan signal Scan1(n) may be held at the gate-on voltage, and the emission signal EM(n) may be inverted to a gate-off voltage. Further, the second scan signal Scan2(n) may be inverted to the gate-on voltage. The second TFT T12 and the fifth TFT T15 may maintain a turn-on state, and the third TFT T13 and the fourth TFT T14 may be turned off.

The third TFT T13 may be turned on. Thus, a voltage of the first node N1 may increase due to the data voltage Vdata via the first TFT T11. Further, a voltage of the second node N2 may increase depending on an increase in the voltage of the first node N1. As a result, a difference in voltage between the gate and the source of the driving TFT DT may be greater than or equal to the threshold voltage Vth of the driving TFT DT, and the driving TFT DT may be turned on.

A voltage of the third node N3 may gradually increase due to a current passing through the source and the drain of the driving TFT DT. Because the gate and the drain of the driving TFT DT may be diode-connected, the voltage of the second node N2 may increase depending on the voltage of the third node N3. As the voltage of the second node N2 increases, the difference in the voltage between the gate and the source of the driving TFT DT may gradually decrease. When the difference in the voltage between the gate and the source of the driving TFT DT is equal to or less than the threshold voltage Vth of the driving TFT DT, the driving TFT DT may be turned off. Consequently, during the sampling period Ts, the second node N2 and the third node N3 may have a voltage "(VDD+Vth)" corresponding to a difference between a high potential voltage VDD and the threshold voltage Vth.

During the sampling period Ts, the first TFT T11 may charge the first node N1 with the data voltage Vdata in response to the second scan signal Scan2($n$). In addition, during the sampling period Ts, the fifth TFT T15 may initialize the fourth node N4 to the reference voltage Vref in response to the first scan signal Scan1($n$).

During the holding period Th, the first scan signal Scan1($n$) may be inverted to the gate-off voltage, and the emission signal EM(n) may hold the gate-off voltage. As a result, the voltages of the first to fourth nodes N1 to N4 may be held at the voltages in the sampling period Ts. During the emission period Tm, the first scan signal Scan1($n$) and the second scan signal Scan2($n$) may hold the gate-off voltage, and the emission signal EM(n) may be inverted to the gate-on voltage.

The third TFT T13 may apply the reference voltage Vref to the first node N1 in response to the emission signal EM(n). Because the voltage of the first node N1 may be the data voltage Vdata during the sampling period Ts, a change in the voltage of the first node N1 may be "(Vdata-Vref)." The change in the voltage of the first node N1 may be reflected to the second node N2 due to the coupling between the first node N1 and the second node N2. Thus, the voltage of the second node N2 may be "(VDD-Vth-(Vdata-Vref))." A driving current Ioled, which may pass through the source and the drain of the driving TFT DT, depending on a change in the voltage of the second node N2, may pass through the fourth node N4, and may be applied to the OLED.

In one example, the first scan line 112a and the data line 111 may cross each other, and may overlap each other at a crossing with at least one insulating layer interposed therebetween. A parasitic capacitor may be formed between the first scan line 112a and the data line 111. Because the first scan line 112a and the data line 111 may be coupled with each other due to the parasitic capacitor between the first scan line 112a and the data line 111, the first scan signal Scan1($n$) may be synchronized with change in the data voltage Vdata. Hence, the first scan signal Scan1($n$) may be distorted due to a ripple generated in the first scan signal Scan1($n$).

For example, as shown in the FIG. 13 example, a first scan signal Scan1($n$+1) of a (n+1)$^{th}$ line may be generated at an on-level subsequent to the first scan signal Scan1($n$) of the n$^{th}$ line, and an on-level period of the first scan signal Scan1($n$+1) may overlap one horizontal period of the latter half of the first scan signal Scan1($n$). For example, a sampling period Ts(n) of the n$^{th}$ line may overlap an initialization period Ti(n+1) of the (n+1)$^{th}$ line. The data voltage Vdata applied to the pixels of the n$^{th}$ line may be applied to the data lines 111 when the first scan signals Scan1($n$) and Scan1($n$+1) of the n$^{th}$ and (n+1)$^{th}$ lines are simultaneously generated at the on-level (e.g., in the sampling period Ts(n) of the n$^{th}$ line).

For example, a gate-on voltage of the first scan signal Scan1($n$+1) of the (n+1)$^t$ line may be affected by a data voltage Vdata(n) applied in the sampling period Ts(n) of the n$^{th}$ line due to the coupling between the data line 111 and the first scan line 112a. Hence, bright and dark lines may occur in the (n+1)$^{th}$ line and may be recognized as a horizontal crosstalk by the user. A horizontal crosstalk phenomenon generated in the pixels of the (n+1)$^{th}$ line may be more remarkably recognized as the number of black gray voltages among the data voltages Vdata(n) applied to the pixels of the n$^{th}$ line increases.

Figure 14:
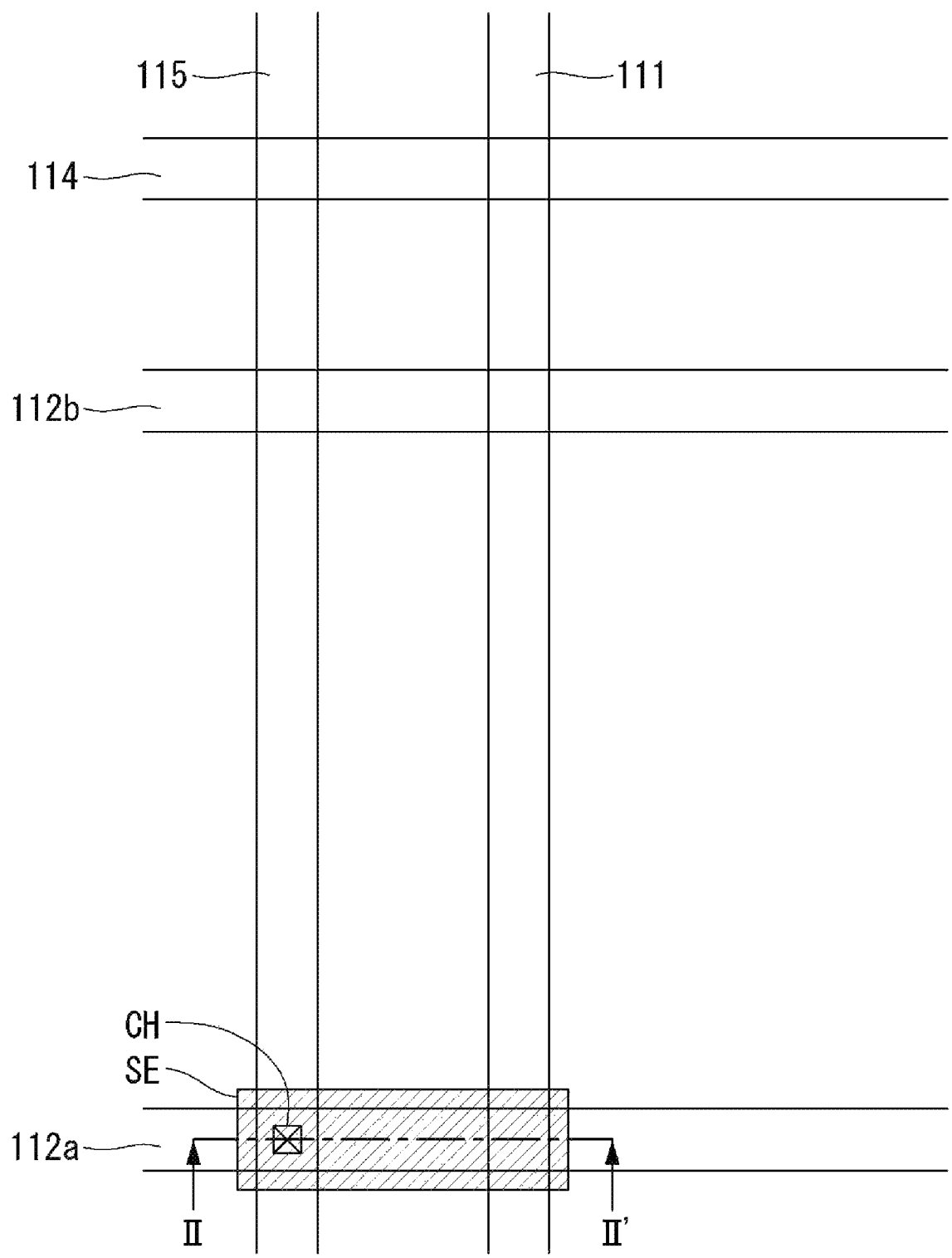
FIG. 14 is a plan view illustrating horizontal lines and vertical lines included in a pixel in an OLED display according to the second example embodiment.
Figure 15:
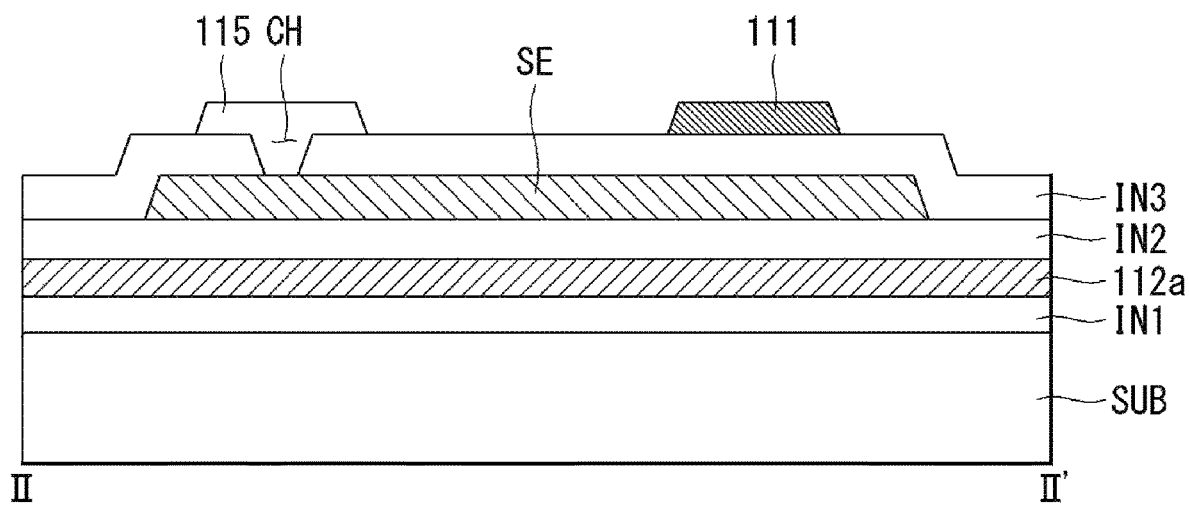
FIG. 15 is a cross-sectional view taken along line II-IF of FIG. 14.

FIG. 14 is a plan view illustrating horizontal lines and vertical lines included in a pixel in an OLED display according to the second example embodiment. FIG. 15 is a cross-sectional view taken along line II-II' of FIG. 14.

As an example, FIG. 14 illustrates only characteristic configuration of the second example embodiment and schematically illustrates only the horizontal lines and the vertical lines for convenience of explanation. As shown in the FIG. 14 example, one pixel may include the first scan line 112a, the second scan line 112b, and the emission line 114 that may extend in a horizontal direction, and the data line 111 and a high potential power line 115 that may extend in a vertical direction. The first scan signal Scan1($n$) may be supplied to the first scan line 112a, and the second scan signal Scan2($n$) may be supplied to the second scan line 112b. The emission signal EM(n) may be supplied to the emission line 114. The data voltage Vdata may be supplied to the data line 111, and a high potential power voltage EVDD may be supplied to the high potential power line 115.

The OLED display according to the second example embodiment may further include a shielding electrode SE connected to a constant voltage source to reduce or prevent the above-described problem. The shielding electrode SE may be formed at a crossing of the first scan line 112a and the data line 111. The shielding electrode SE may be spaced apart from the first scan line 112a in an overlap portion between the first scan line 112a and the data line 111, and at least one second insulating layer IN2 may be interposed therebetween. The shielding electrode SE may be spaced apart from the data line 111 in the overlap portion between the first scan line 112a and the data line 111, and at least one third insulating layer IN3 may be interposed therebetween. For example, the first scan line 112a, the shielding electrode SE, and the data line 111 may be disposed on different layers on a substrate SUB with one or more insulating layers IN1, IN2, and IN3 interposed therebetween, and may be spaced apart from one another on the substrate SUB.

For example, as shown in FIG. 15, the first scan line 112a may be formed on the substrate SUB. At least one first insulating layer IN1 may be further disposed between the substrate SUB and the first scan line 112a. The shielding electrode SE may be formed on the first scan line 112a, and at least one second insulating layer IN2 may be interposed therebetween. The data line 111 and the high potential power line 115 may be disposed to be spaced apart from each other on the shielding electrode SE, and at least one third insulating layer IN3 may be interposed therebetween.

The data line 111 may cross the first scan line 112a. The shielding electrode SE may be disposed to overlap the first scan line 112a and the data line 111 at the crossing of the first scan line 112a and the data line 111. The high potential power line 115 may be connected to the shielding electrode SE through a contact hole CH penetrating at least one third insulating layer IN3 between the high potential power line 115 and the shielding electrode SE.

The OLED display according to the second example embodiment may further include the shielding electrode SE, thereby removing the coupling between the first scan line 112a and the data line 111 through a reduction in a parasitic capacitance between the first scan line 112a and the data line 111. Hence, the second example embodiment can prevent or reduce the ripple resulting from the change in the data voltage Vdata from occurring in the first scan signal Scan1 (n), and thus can provide an OLED display with improved display quality.

Third Example Embodiment

Figure 16:
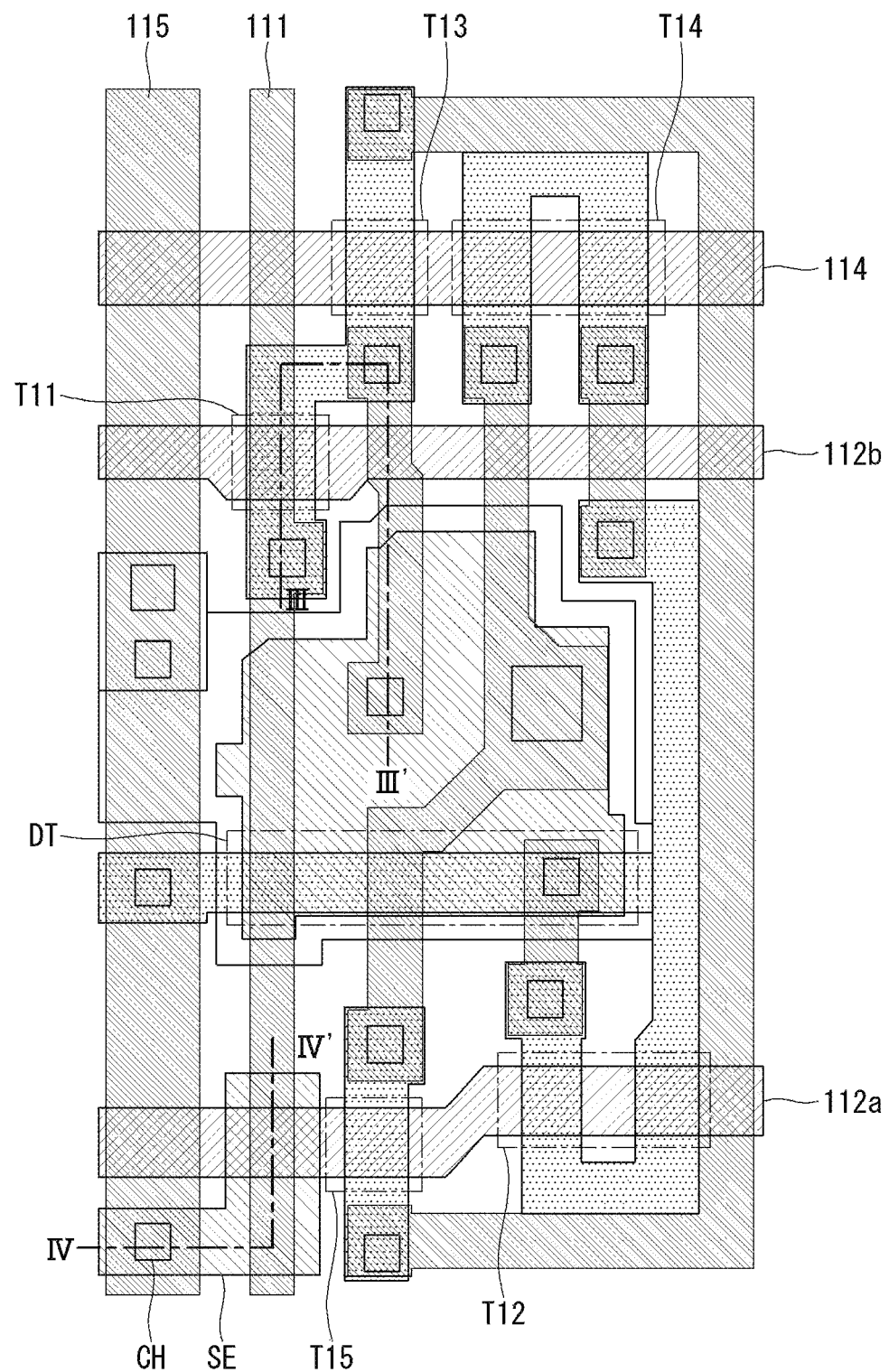
FIG. 16 is a plan view illustrating an example in which an OLED display according to a third example embodiment includes a pixel array of the 6T1C structure shown in FIG. 11.
Figure 17A:
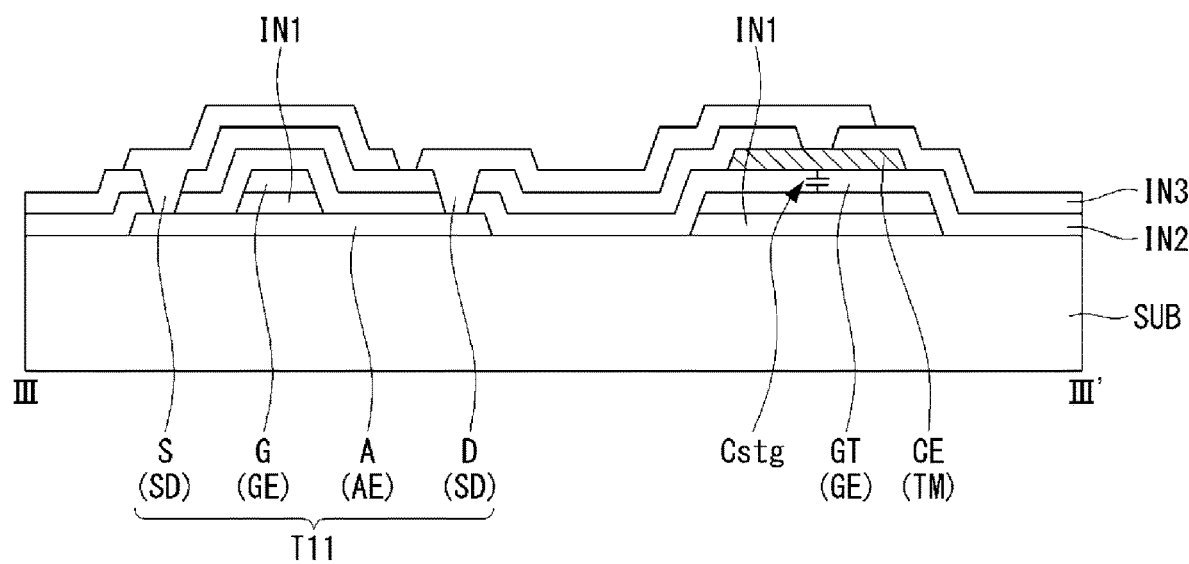
FIGS. 17A and 17B are cross-sectional views respectively taken along lines III-III' and IV-IV' of FIG. 16.
Figure 17B:
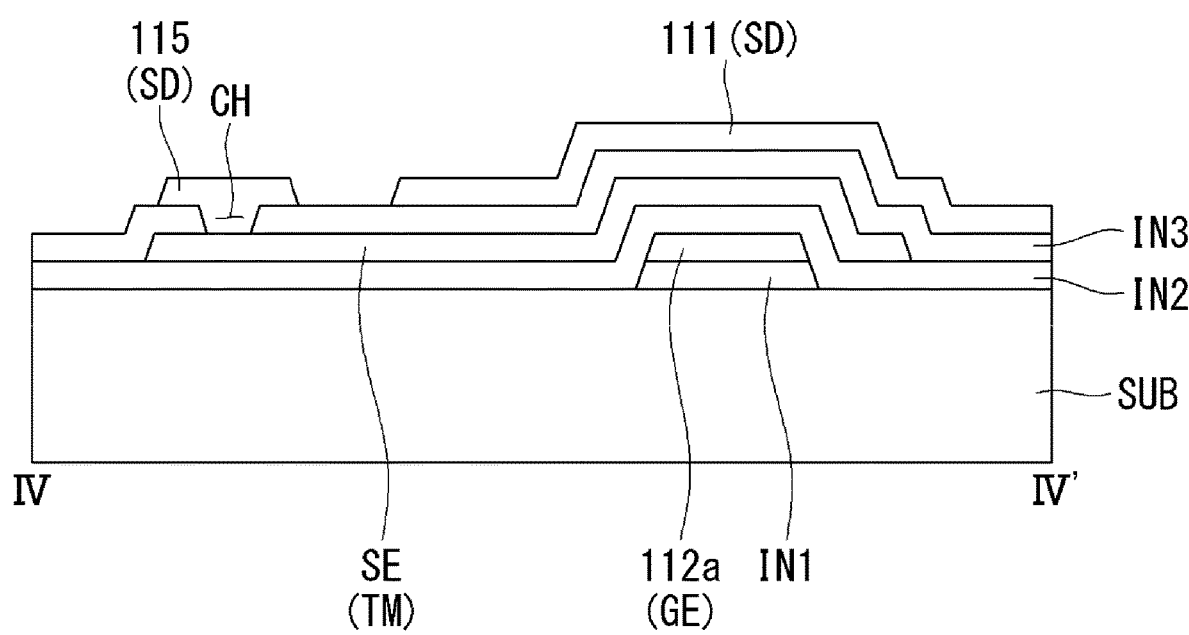
Figure 18A:
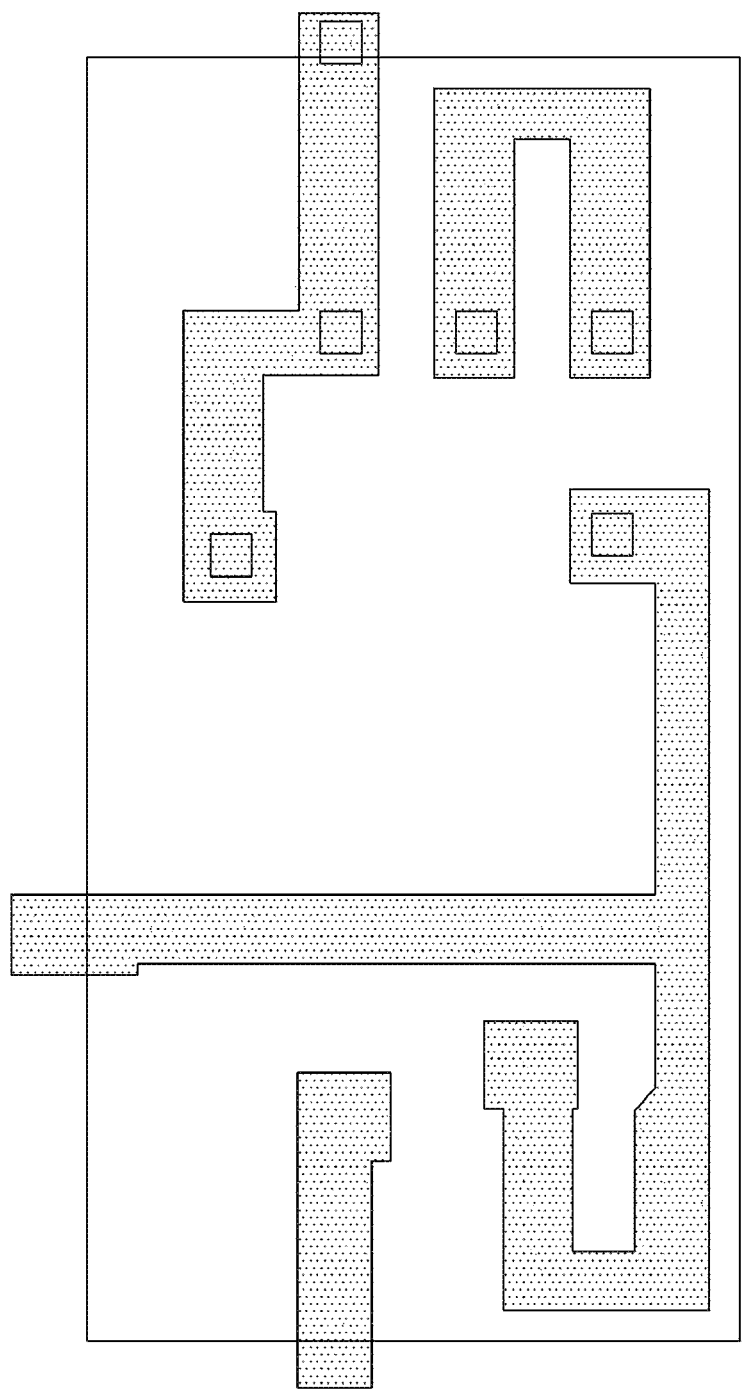
FIGS. 18A to 18D illustrate partial layers of the structure shown in FIG. 16.
Figure 18B:
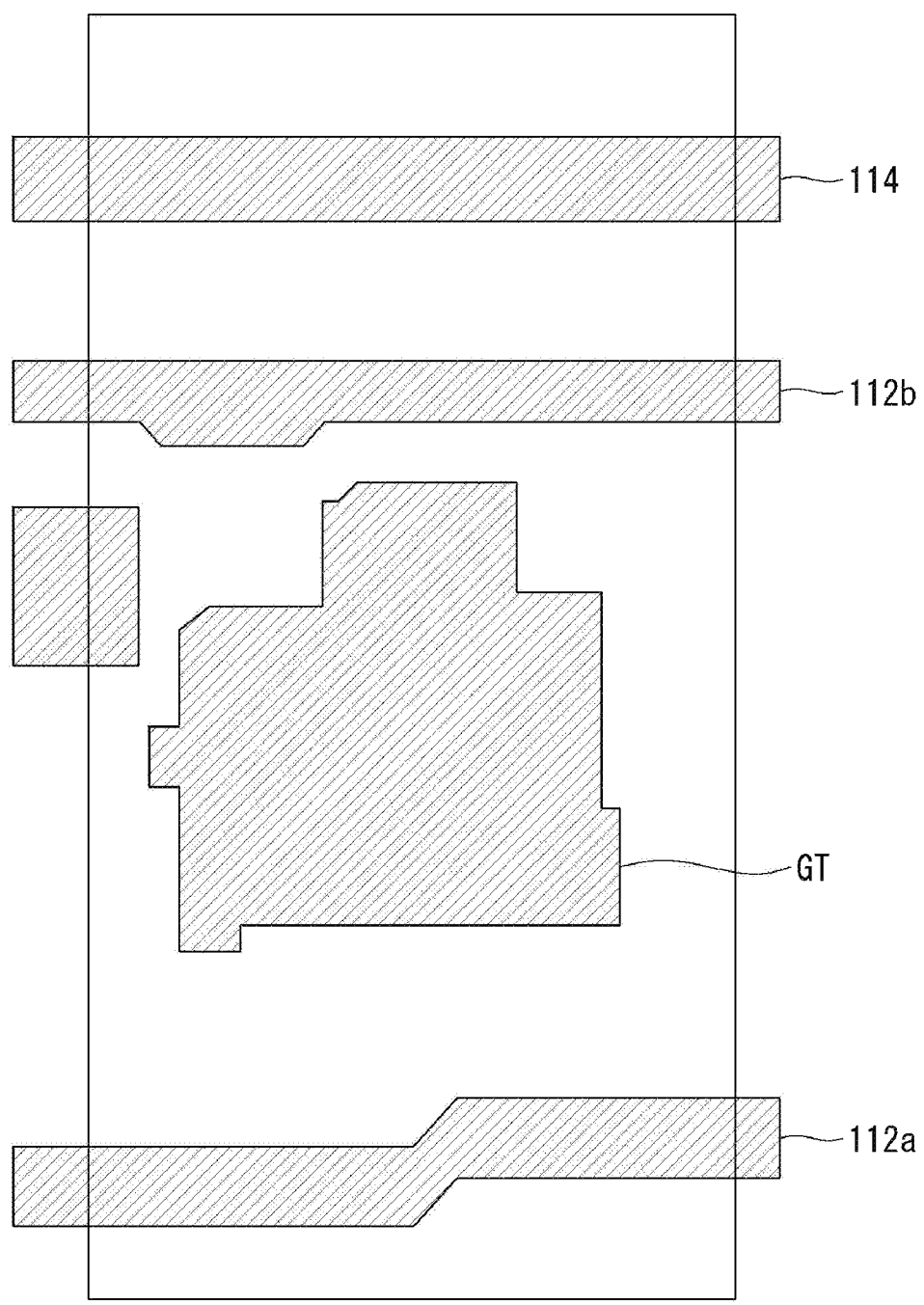
Figure 18C:
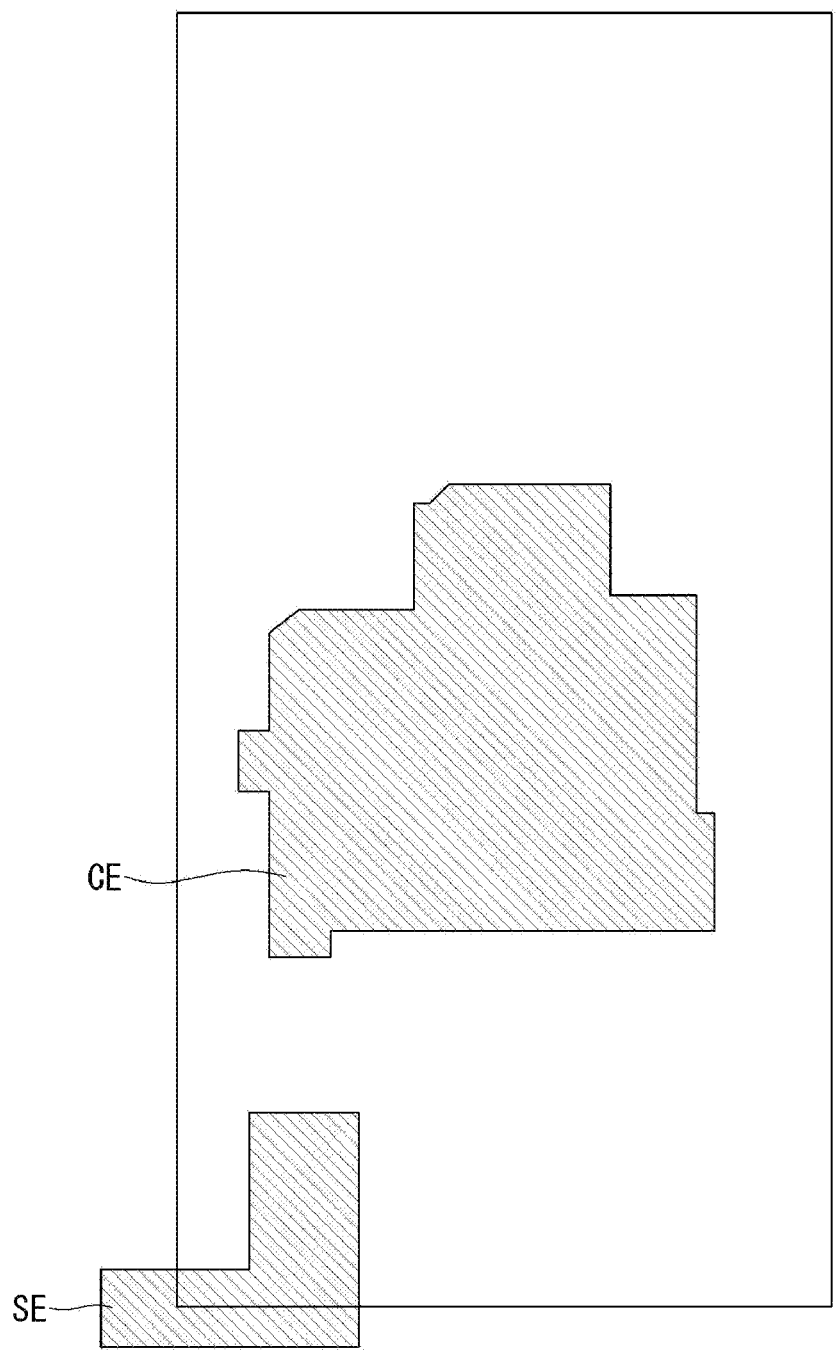
Figure 18D:
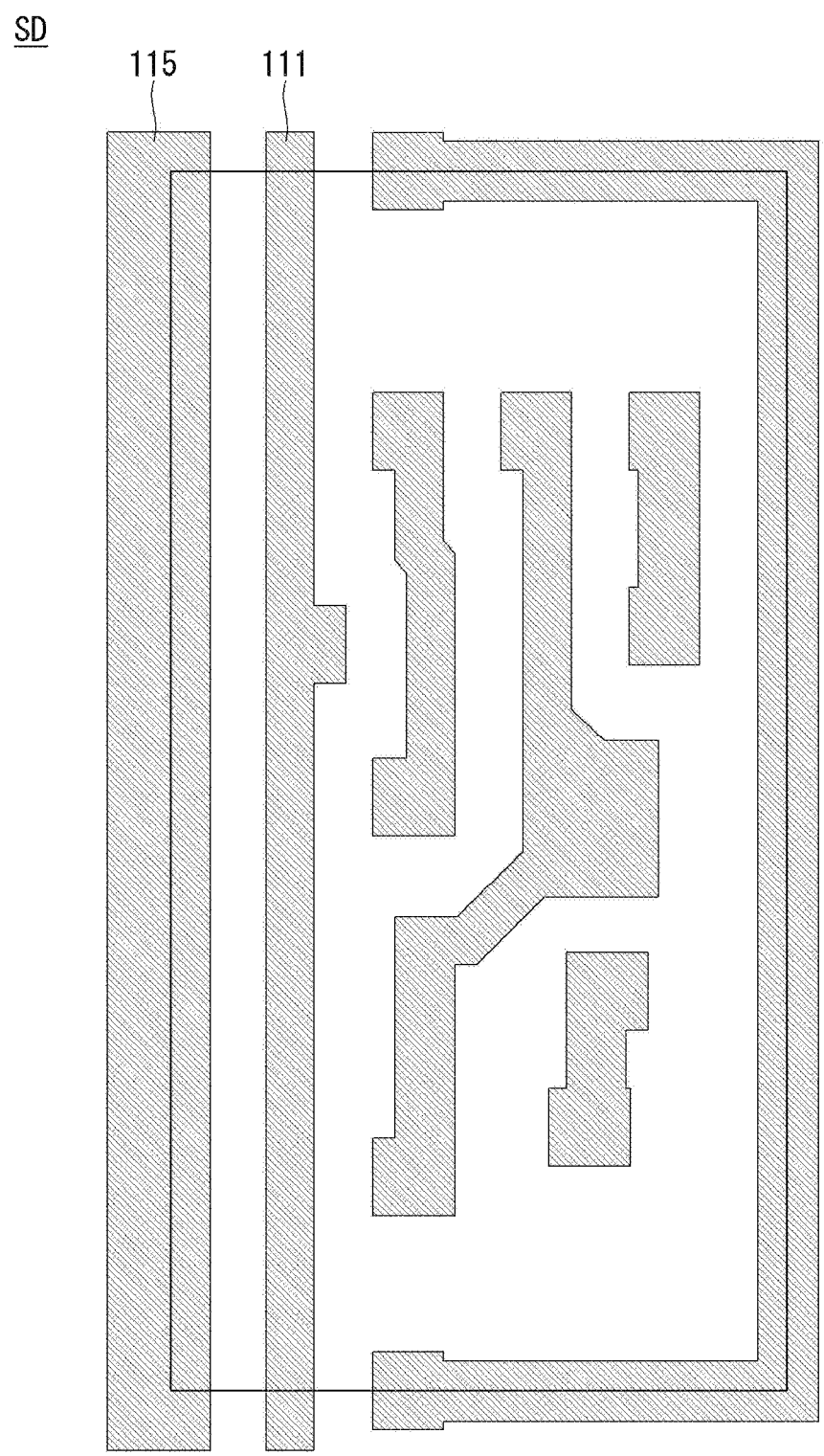

FIG. 16 is a plan view illustrating an example in which an OLED display according to a third example embodiment includes a pixel array of the 6T1C structure shown in FIG. 11. FIGS. 17A and 17B are cross-sectional views respectively taken along lines and IV-IV' of FIG. 16. FIGS. 18A to 18D illustrate partial layers of the structure shown in FIG. 16.

An OLED display according to a third example embodiment is described with reference to FIG. 16, FIGS. 17A and 17B, and FIGS. 18A to 18D. The pixel array of the 6T1C structure shown in FIG. 11 may be implemented as shown in FIG. 16, FIGS. 17A and 17B, and FIGS. 18A to 18D.

With reference to the examples of FIGS. 11 and 16, FIGS. 17A and 17B, and FIGS. 18A to 18D, semiconductor elements AE may be formed on a substrate SUB. The semiconductor elements AE may include a semiconductor layer "A" corresponding to each of transistors T11, T12, T13, T14, T15, and DT. A first insulating layer IN1 may be applied on the semiconductor element AE. The first insulating layer IN1 may be referred to as a "gate insulating layer." Although not shown, the first insulating layer IN1 may be formed on the entire surface of the substrate SUB to cover the semiconductor elements AE.

Gate elements GE may be formed on the first insulating layer IN1. The gate elements GE may include a gate electrode G of each of the transistors T11, T12, T13, T14, T15, and DT; and may further include a first scan line 112a, a second scan line 112b, and an emission line 114 that may extend in a horizontal direction. A portion of the semiconductor layer "A" overlapping the gate electrode G of each of the transistors T11, T12, T13, T14, T15, and DT may be defined as a channel region. Based on the channel region, one side of the semiconductor layer "A" may be defined as a source region, and the other side of the semiconductor layer "A" may be defined as a drain region. A second insulating layer IN2 may be applied on the gate elements GE.

Auxiliary elements TM may be formed on the second insulating layer IN2. The auxiliary elements TM may include a first electrode CE and a shielding electrode SE. The first electrode CE may be connected to a drain D of the first TFT T11, and may overlap a gate electrode GT of the driving TFT DT with the second insulating layer IN2 interposed therebetween, thereby forming a storage capacitor Cstg. The shielding electrode SE may be connected to a high potential power line 115, and may overlap the data line 111 and the first scan line 112a at a crossing of the data line 111 and the first scan line 112a. The shielding electrode SE may overlap the first scan line 112a with the second insulating layer IN2 interposed therebetween. A third insulating layer IN3 may be applied on the auxiliary elements TM.

Source and drain elements SD may be formed on the third insulating layer IN3. The source and drain elements SD may include a source electrode S and a drain electrode D of each of the transistors T11, T12, T13, T14, T15, and DT, and the data line 111 and the high potential power line 115 that may extend in a vertical direction. The source electrode S may be connected to a source region of each of the transistors T11, T12, T13, T14, T15, and DT through a contact hole penetrating the second insulating layer IN2 and the third insulating layer IN3. The drain electrode D may be connected to a drain region of each of the transistors T11, T12, T13, T14, T15, and DT through a contact hole penetrating the second insulating layer IN2 and the third insulating layer IN3. The data line 111 may cross the first scan line 112a, and may overlap the shielding electrode SE at a crossing of the data line 111 and the first scan line 112a. The data line 111 may overlap the shielding electrode SE with the third insulating layer IN3 interposed therebetween. The high potential power line 115 may be connected to the shielding electrode SE through a contact hole CH penetrating the third insulating layer IN3.

The third example embodiment can form the shielding electrode SE at the same time (e.g., in a same process) as forming the first electrode CE for forming the storage capacitor Cstg, and thus may not need to separately perform an additional process forming the shielding electrode SE. Hence, the third example embodiment can save process time, process cost, etc. resulting from the additional process, and also may remarkably improve the process yield by reducing the process defects.

Fourth Example Embodiment

Figure 19:
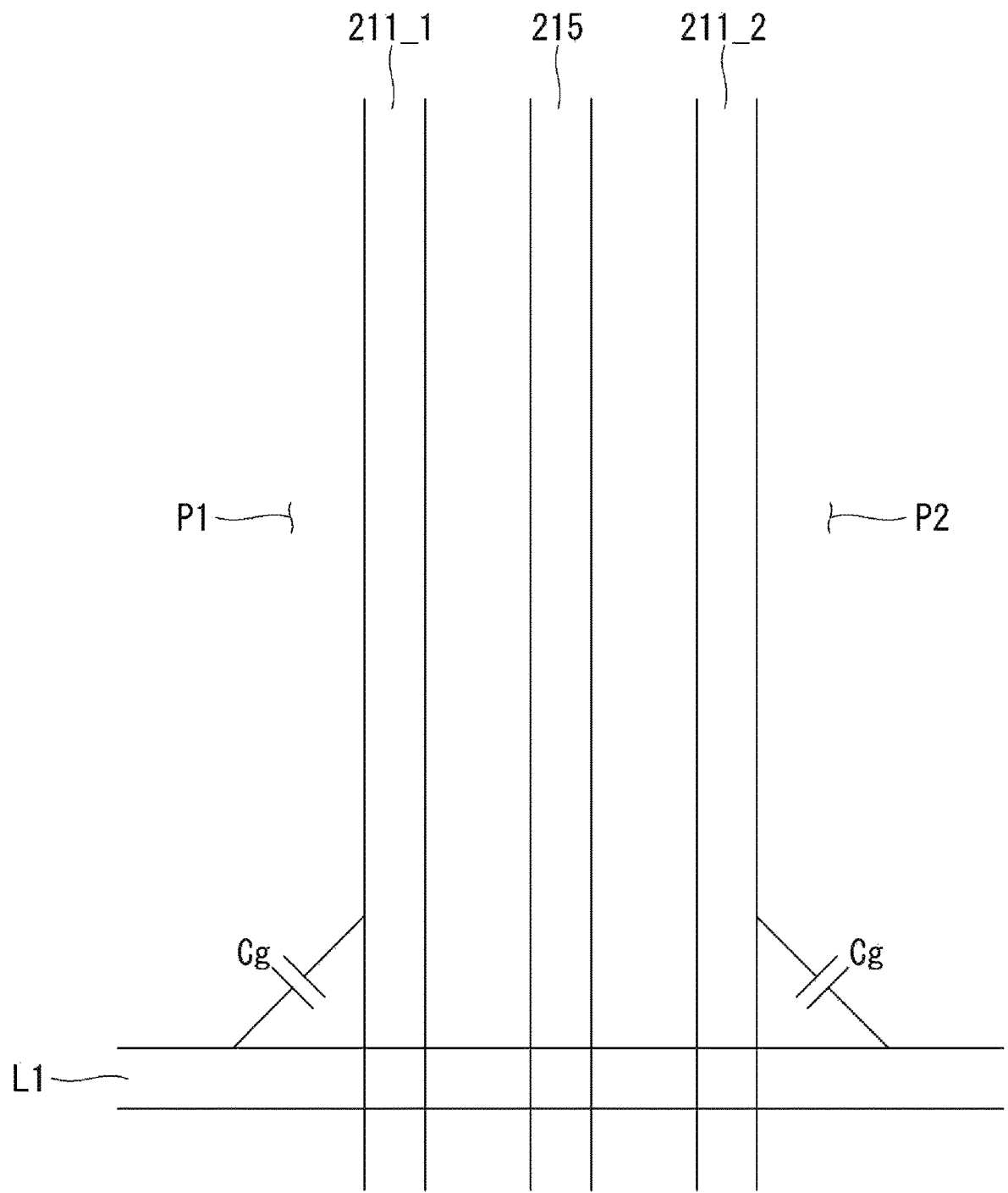
FIGS. 19 and 20 are plan views illustrating horizontal lines and vertical lines included in two pixels in an OLED display according to a fourth example embodiment.
Figure 20:
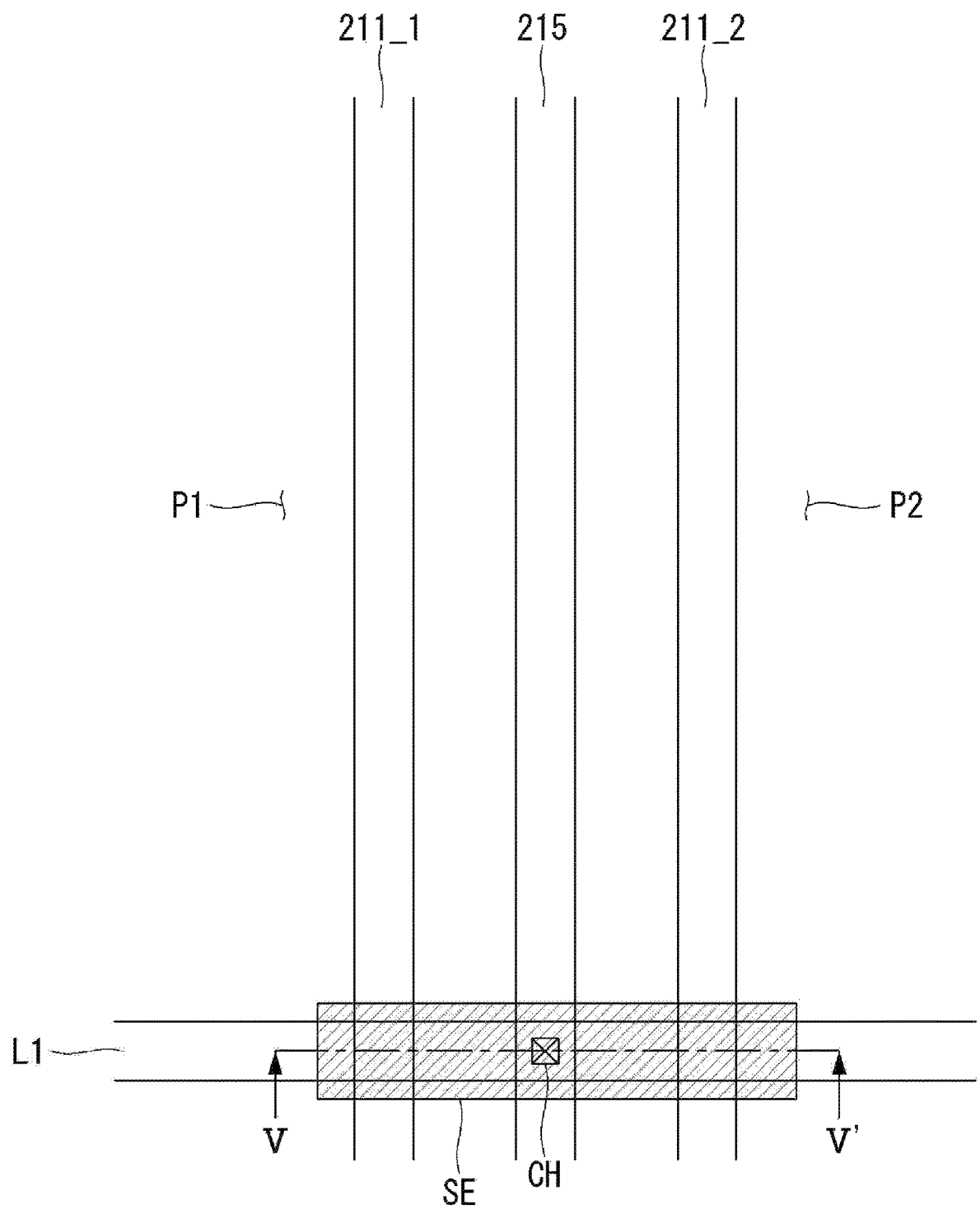
Figure 21:
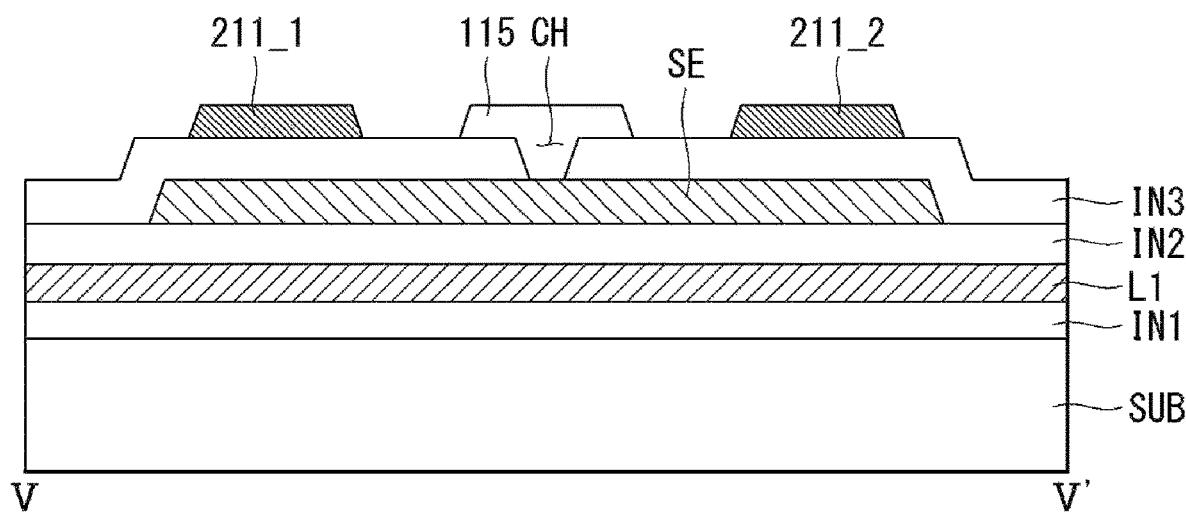
FIG. 21 is a cross-sectional view taken along line V-V' of FIG. 20.

FIGS. 19 and 20 are plan views illustrating horizontal lines and vertical lines included in two pixels in an OLED display according to a fourth example embodiment. FIG. 21 is a cross-sectional view taken along line V-V' of FIG. 20.

An effect of an OLED display according to a fourth example embodiment is described in detail with reference to FIGS. 19 to 21. As shown in the FIG. 19 example, the OLED display according to the fourth example embodiment may include a first pixel P1 and a second pixel P2 that may be disposed adjacent to each other in a horizontal direction. The first pixel P1 may be defined by a horizontal line L1 and a first data line 211_1. The first data line 211_1 may supply a data voltage to the first pixel P1. The second pixel P2 may be defined by the horizontal line L1 and a second data line 211_2. The second data line 211_2 may supply the data voltage to the second pixel P2.

The first pixel P1 and the second pixel P2 that may be adjacent to each other in the horizontal direction may share one power line 215 with each other. The power line 215 may cross the horizontal line L1, and may extend in parallel with the first and second data lines 211_1 and 211_2. The power line 215 may be provided between the first and second data lines 211_1 and 211_2. The power line 215 may be supplied with a high potential power voltage.

The horizontal line L1 and the first data line 211_1 may cross each other, and may overlap each other at a crossing of the horizontal line L1 and the first data line 211_1, and at least one insulating layer may be interposed therebetween. A parasitic capacitor Cg may be formed between the horizontal line L1 and the first data line 211_1. The horizontal line L1 and the second data line 211_2 may cross each other, and may overlap each other at a crossing of the horizontal line L1 and the second data line 211_2, and at least one insulating layer may be interposed therebetween. A parasitic capacitor Cg may be formed between the horizontal line L1 and the second data line 211_2.

Because the horizontal line L1 may be coupled with the first and second data lines 211_1 and 211_2 due to the parasitic capacitor Cg between the horizontal line L1 and the first data line 211_1 and the parasitic capacitor Cg between the horizontal line L1 and the second data line 211_2, poor image quality may occur due to signal interference. For example, the poor image quality described in the first and second embodiments may occur.

As shown in the examples of FIGS. 20 and 21, the OLED display according to the fourth example embodiment may further include a shielding electrode SE connected to the power line 215. The shielding electrode SE may be formed at the crossing of the horizontal line L1 and the first data line 211_1, and at the crossing of the horizontal line L1 and the second data line 211_2. The shielding electrode SE may be spaced apart from the horizontal line L1 in an overlap portion between the horizontal line L1 and the first data line 211_1 and in an overlap portion between the horizontal line L1 and the second data line 211_2, and at least one second insulating layer IN2 may be interposed therebetween. The shielding electrode SE may be spaced apart from the first and second data lines 211_1 and 211_2 in the overlap portion between the horizontal line L1 and the first data line 211_1 and in the overlap portion between the horizontal line L1 and the second data line 211_2, and at least one third insulating layer IN3 may be interposed therebetween. For example, the horizontal line L1, the shielding electrode SE, and the first and second data lines 211_1, 211_2 may be disposed on different layers on a substrate SUB with one or more insulating layers IN1, IN2, and IN3 interposed therebetween, and may be spaced apart from one another on the substrate SUB.

The shielding electrode SE may be extended from the crossing of the horizontal line L1 and the first data line 211_1 to the crossing of the horizontal line L1 and the second data line 211_2. The shielding electrode SE may cross the power line 215 between the first data line 211_1 and the second data line 211_2. The shielding electrode SE may be spaced apart from the power line 215, and at least one third insulating layer IN3 may be interposed therebetween. The shielding electrode SE may be connected to the power line 215 through a contact hole CH penetrating the insulating layer IN3 between the power line 215 and the shielding electrode SE.

In the example description of the embodiments, it is described that the first and second touch electrodes have a bar-shape. However, this description is not intended to limit embodiments, but merely illustrates one example for convenience of explanation. Accordingly, it is to be understood that embodiments are not limited thereto and include all known forms.

It will be apparent to those skilled in the art that various modifications and variations may be made in the present disclosure without departing from the technical idea or scope of the disclosure. Thus, it may be intended that embodiments of the present disclosure cover the modifications and variations of the disclosure provided they come within the scope of the appended claims and their equivalents.

What is claimed is:

1. An organic light-emitting diode display including a plurality of pixels, each pixel including an organic light-emitting diode, the organic light-emitting diode display comprising:
    a substrate;
    a horizontal line on the substrate;
    at least one first insulating layer on the horizontal line;
    a shielding electrode on the at least one first insulating layer;
    at least one second insulating layer on the shielding electrode;
    a data line on the at least one second insulating layer, the data line crossing the horizontal line, the shielding electrode overlapping the horizontal line and the data line at a crossing of the horizontal line and the data line; and
    a constant voltage source connected to the shielding electrode,
    wherein the shielding electrode is interposed between the horizontal line and the data line at the crossing of the horizontal line and the data line.

2. The organic light-emitting diode display of claim 1, further comprising:
    at least one third insulating layer on shielding electrode; and
    a power line on the at least one third insulating layer, the power line being connected to the constant voltage source, the power line being spaced apart from the data line and at a same layer as the data line, the power line being connected to the shielding electrode through a contact hole penetrating the at least one third insulating layer.

3. The organic light-emitting diode display of claim 1, wherein the horizontal line comprises:
    a first scan line configured to supply a first scan signal to the pixels;
    a second scan line configured to supply a second scan signal to the pixels; and
    an emission line configured to supply an emission signal to the pixels.

4. The organic light-emitting diode display of claim 3, further comprising:
    a first power line configured to supply a high potential power voltage to the pixels; and
    a second power line configured to supply an initialization voltage to the pixels,
    wherein each pixel includes:
        a driving thin film transistor (TFT) configured to supply a current to the organic light-emitting diode,
        a first TFT configured to switch a current path between the data line and a first node in response to the first scan signal,
        a second TFT configured to switch a current path between the first power line and the driving TFT in response to the emission signal,
        a third TFT configured to switch a current path between the second power line and a second node in response to the second scan signal,
        a first capacitor connected between the first node and the second node, and
        a second capacitor connected between the first power line and the second node, and
    wherein the shielding electrode is between the first scan line and the data line.

5. The organic light-emitting diode display of claim 3, further comprising:
    a first power line configured to supply a high potential power voltage to the pixels; and
    a third power line configured to supply a reference voltage to the pixels,
    wherein each pixel includes:
        a driving thin film transistor (TFT) configured to supply a current to the organic light-emitting diode connected to a fourth node,
        a capacitor comprising:
            a first electrode connected to a first node; and
            a second electrode connected to a gate electrode of the driving TFT via a second node, a first switching TFT configured to switch a current path between the data line and the first node in response to the second scan signal, a second switching TFT configured to switch a current path between the second node and a third node in response to the first scan signal, a third switching TFT configured to switch a current path between the first node and the third power line in response to the emission signal, a fourth switching TFT configured to switch a current path between the third node and the fourth node in response to the emission signal, and a fifth switching TFT configured to switch a current path between the fourth node and the third power line in response to the first scan signal, and wherein the shielding electrode is between the first scan line and the data line.

6. The organic light-emitting diode display of claim 5, further comprising:

a semiconductor layer on the substrate, the at least one first insulating layer being on the semiconductor layer;

gate elements on the at least one first insulating layer, the at least one second insulating layer covering the gate elements, the gate elements comprising:
the first scan line;
the second scan line;
the emission line;
gate electrodes of the first to fifth switching TFTs; and
the gate electrode of the driving TFT;

auxiliary elements on the at least one second insulating layer, the auxiliary elements comprising:
the first electrode of the capacitor; and
the shielding electrode;

a third insulating layer covering the auxiliary elements; and source and drain elements on the third insulating layer, the source and drain elements comprising:
the data line;
the first power line;
source and drain electrodes of the first to fifth switching TFTs; and
source and drain electrodes of the driving TFT.

7. The organic light-emitting diode display of claim 6, wherein the shielding electrode is connected to the first power line through a contact hole penetrating the third insulating layer.

8. The organic light-emitting diode display of claim 1, further comprising:

a power line connected to the constant voltage source, the power line crossing the horizontal line, wherein the plurality of pixels includes a first pixel and a second pixel adjacent to each other in a horizontal direction and sharing the power line with each other, and wherein the data line comprises:
a first data line supplying a data voltage to the first pixel, and
a second data line supplying the data voltage to the second pixel.

9. The organic light-emitting diode display of claim 8, wherein:

the power line is between the first data line and the second data line;

the shielding electrode is extended from a crossing of the horizontal line and the first data line to a crossing of the horizontal line and the second data line; and the shielding electrode crosses the power line.

* * * * *